(12) United States Patent
Luk et al.

(10) Patent No.: US 8,324,667 B2
(45) Date of Patent: *Dec. 4, 2012

(54) AMPLIFIERS USING GATED DIODES

(75) Inventors: Wing K. Luk, Chappaqua, NY (US); Robert H. Dennard, Croton on Hudson, NY (US)

(73) Assignee: International Business Machines Corporation, Armonk, NY (US)

(*) Notice: Subject to any disclaimer, the term of this patent is extended or adjusted under 35 U.S.C. 154(b) by 1327 days.

This patent is subject to a terminal disclaimer.

(21) Appl. No.: 10/751,714

(22) Filed: Jan. 5, 2004

(65) Prior Publication Data

US 2005/0145895 A1    Jul. 7, 2005

(51) Int. Cl.
*H01L 29/94* (2006.01)
(52) U.S. Cl. .................. 257/288; 365/208
(58) Field of Classification Search .......... None
See application file for complete search history.

(56) References Cited

U.S. PATENT DOCUMENTS

| | | | | |
|---|---|---|---|---|
| 3,805,176 A * | 4/1974 | Kudo et al. | ...... | 330/4.9 |
| 4,999,812 A * | 3/1991 | Amin | ...... | 365/185.12 |
| 5,386,151 A * | 1/1995 | Folmsbee | ...... | 327/536 |
| 5,844,265 A * | 12/1998 | Mead et al. | ...... | 257/291 |
| 6,097,432 A * | 8/2000 | Mead et al. | ...... | 348/302 |
| 6,130,469 A * | 10/2000 | Bracchitta et al. | ...... | 257/530 |
| 6,687,175 B1 * | 2/2004 | Mizuno et al. | ...... | 365/203 |
| 7,116,594 B2 * | 10/2006 | Luk et al. | ...... | 365/205 |
| 2004/0136251 A1 * | 7/2004 | Mizuno et al. | ...... | 365/203 |
| 2004/0263272 A1 * | 12/2004 | Ravi et al. | ...... | 331/177 V |

OTHER PUBLICATIONS

Allen et al., "CMOS Analog Circuit Design," p. 469 (1987).

* cited by examiner

*Primary Examiner* — Johannes P Mondt
(74) *Attorney, Agent, or Firm* — Ryan, Mason & Lewis, LLP

(57) ABSTRACT

A circuit comprises a control line and a two terminal semiconductor device having first and second terminals. The first terminal is coupled to a signal line, and the second terminal is coupled to the control line. The two terminal semiconductor device is adapted to have a capacitance when a voltage on the first terminal relative to the second terminal is above a threshold voltage and to have a smaller capacitance when a voltage on the first terminal relative to the second terminal is below the threshold voltage. The control line is coupled to a control signal and the signal line is coupled to a signal and is output of the circuit. A signal is placed on the signal line and voltage on the control line is modified (e.g., raised in the case of n-type devices, or lowered for a p-type devices). When the signal falls below the threshold voltage, the two terminal semiconductor device acts as a very small capacitor and the output of the circuit will be a small value. When the signal is above the threshold voltage, the two terminal semiconductor device acts as a large capacitor and the output of the circuit will be influenced by both the value of the signal and the value of the modified voltage on the control line and therefore the signal will be amplified.

7 Claims, 20 Drawing Sheets

GATED DIODE CAPACITANCE vs GATE-TO-SOURCE VOLTAGE (Vgs)
EACH CURVE REPRESENTS A DIFFERENT GATED DIODE GATE SIZE.
THRESHOLD VOLTAGE = 0.2 V

GATED DIODE AMPLIFIER REPRESENTATIVE CIRCUIT

GATED DIODE AMPLIFIER REPRESENTATIVE CIRCUIT

AMPLIFIERS USING GATED DIODES

CROSS REFERENCE TO RELATED APPLICATIONS

This application is related to an application by Luk et al., entitled 3T1D MEMORY CELLS USING GATED DIODES AND METHODS OF USE THEREOF, U.S. patent Ser. No. 10/751,713, filed on the same day as the present application and assigned to International Business Machines, Inc., the disclosure of which is hereby incorporated by reference.

FIELD OF THE INVENTION

The present invention relates to semiconductors and, more particularly, relates to semiconductor devices and circuits using the same for amplifying signals.

BACKGROUND OF THE INVENTION

High speed, small signal sensing amplifiers are commonly needed in memory such as Dynamic Random Access Memory (DRAM) and Static Random Access Memory (SRAM). Small signal sensing circuits are used because the current trend is toward small signal transmission over wide data buses either external or internal to a semiconductor chip. Small signal transmission is being more widely used because switching power is proportional to $CV^2f$, where C is the capacitance, V is the voltage, and f is the frequency of switching. The frequency used for switching on buses has constantly increased, as the frequency is related to how much data per unit time can be shuttled through the buses. To limit power, the voltage has been decreasing too. Thus, small signals are being transmitted through buses, and these small signals require small signal detection and amplification at the receiving end. For example, voltages under one volt are being used as the high logic level for small signals. The small signal sensing circuits can operate in single ended mode, namely using only one signal relative to ground (GND) or supply voltage (VDD). The small signal sensing circuits can also operate in differential signal mode, using a pair of differential signals.

In conventional single ended, small signal sense circuits such as class A amplifiers, there are a number of items that are very difficult to control: biasing of the operating point; stability of the reference voltage; biasing current; sensitivity to threshold voltage; and process and temperature variations. This is especially true for future technology, due to increasing high leakage current and low supply voltage as transistors are scaled smaller, making such circuits very sensitive to voltage, temperature and process variations. For conventional differential sense circuits, due to the increasing statistical variation between adjacent transistors in future technology, the advantage of differential mode small signal sensing is diminishing.

Thus, there is a need to provide improved amplifiers for uses such as signal sensing.

SUMMARY OF THE INVENTION

Exemplary aspects of the present invention provide improved amplifiers using gated diodes and methods of using the same.

In an exemplary aspect of the invention, a circuit is disclosed that is suitable for amplifying signals. The circuit comprises a control line and a two terminal semiconductor device having first and second terminals. The first terminal is coupled to a signal line, and the second terminal is coupled to the control line. The control line is adapted to be coupled to a control signal and the signal line is adapted to be coupled to a signal and to be an output of the circuit.

The two terminal semiconductor device is adapted to have a capacitance when a voltage on the first terminal relative to the second terminal is larger than a predetermined voltage, and to have a smaller capacitance when the voltage on the first terminal relative to the second terminal is less than the predetermined voltage. The predetermined voltage may be called the threshold voltage of the semiconductor device. Typically, the voltage on the first terminal relative to the second terminal only has to be a small amount above the threshold voltage for the capacitance to be substantially larger than when the voltage is below the threshold voltage, as shown in detail below. As a result, the equivalent capacitance of the two terminal semiconductor device is nonlinear, e.g., a large capacitance when the voltage on the first terminal relative to the second terminal is above the threshold voltage, and a very small capacitance when the voltage on the first terminal relative to the second terminal is below the threshold voltage. In terms of electric charge stored in the two terminal device, a voltage on the first terminal relative to the second terminal above the threshold voltage causes a large amount of charge to be stored in the device, and a voltage on the first terminal relative to the second terminal below the threshold voltage causes a substantially smaller amount of charge, orders of magnitude smaller, or no charge to be stored.

In contrast to this is the case of conventional capacitor or linear capacitor, where the capacitance is a constant regardless of the voltage across its two terminals, and the amount of charge change is proportional to the amount of voltage change.

An example of a two terminal semiconductor device is a gated diode comprising a source (e.g., a source diffusion area) and a gate, where charge is stored in an inversion layer when the gate to source voltage (Vgs) of the gated diode is above (e.g., for an n-type gated diode) a threshold voltage, and substantially small amount of charge, orders of magnitude smaller, or no charge is stored otherwise. In a gated diode, a source input, coupled to the source, acts as the second terminal and a gate input, coupled to the gate, acts as the first terminal.

A gated diode may be implemented in a number of ways, such as through a device comprising an insulator formed between a gate and a well, a source diffusion region abutting and overlapping one side of the insulator and gate, and a shallow trench isolation region abutting another side of the insulator and gate, wherein the source input is coupled to the source diffusion region and the gate input is coupled to the gate. Additionally, the gated diode could comprise an insulator formed between a gate and a well, a source diffusion region abutting and overlapping one side of the insulator and gate, a drain diffusion region abutting and overlapping another side of the insulator and gate, and a coupling that directly couples the source and drain regions, wherein the source input is coupled to the source diffusion region and the gate input is coupled to the gate. The gated diode can be made from n-type or p-type devices. The gated diode may be formed using, for example, typical Field Effect Transistor (FET) in bulk-silicon, Silicon-On-Insulator (SOI), or dual gate finFET technologies.

A second circuit can additionally comprise an isolation device on the signal line intermediate the signal and the gate input. The isolation device allows, for instance, separation of load between the gated diode and the signal line and, as another example, prevention of voltage rise at the gate input of the gated diode from affecting the signal on the signal line.

The isolation device may be beneficially designed to isolate the gated diode from the signal on the signal line when the signal is a predetermined voltage. The isolation device can be made from an n-type or a p-type device. Additionally, the second circuit can comprise an output device such as a buffer or latch. Furthermore, two such circuits may be used in a differential circuit having also a differential signal output device, such as a differential buffer or differential latch.

In another aspect of the invention, methods for sensing signals are disclosed using the previously described circuits. An exemplary method determines that a voltage on the signal line is to be sensed, and voltage on the control line is modified (e.g., raised in the case of n-type devices, or lowered for a p-type devices). When the signal falls below the threshold voltage, the two terminal semiconductor device acts as a very small capacitor and holds a very small amount of charge and the output of the circuit will be a small value, approximately a small fraction (e.g., one-tenth) of the voltage on the control line. When the signal is above the threshold voltage, the two terminal semiconductor device acts as a large capacitor and holds a large amount of charge and the output of the circuit will be influenced by both the value of the signal and the value of the modified voltage on the control line and therefore the signal will be amplified to approximately the voltage on the control line plus the voltage of the signal.

A more complete understanding of the present invention, as well as further features and advantages of the present invention, will be obtained by reference to the following detailed description and drawings.

BRIEF DESCRIPTION OF THE DRAWINGS

FIG. 11C shows a representative circuit for the gated diode amplifier of FIG. 11A when the gated diode is turned on;

DETAILED DESCRIPTION OF PREFERRED EMBODIMENTS

For ease of reference, the following disclosure is separated into the following sections: Introduction and Gated Diode Structures; and Gated Diode Amplifier and Small Signal Sense Amplifier Circuits.

Introduction and Gated Diode Structures

The term "gated diode" as used herein refers to a two terminal semiconductor device comprised of a source and a gate, where a relatively large amount of charge is stored in an inversion layer when the gate to source voltage (Vgs) is above (for an n-type gated diode) a threshold voltage, and substantially small amount, orders of magnitude smaller, or no charge is stored otherwise. As a result, the equivalent capacitance of the two terminal semiconductor device is nonlinear, meaning that the two terminal semiconductor device has a large capacitance when the voltage on the first terminal relative to the second terminal is above the threshold voltage and has a very small capacitance when the voltage on the first terminal relative to the second terminal is below the threshold voltage. A gated diode is an example of a two terminal semiconductor device. Any two terminal semiconductor device may be used having the property that the two terminal device has a large capacitance when a voltage on the first terminal relative to the second terminal is larger than a predetermined voltage by typically a slight amount, and a substantially small capacitance, orders of magnitude smaller, when the voltage on the first terminal relative to the second terminal is less than the predetermined voltage. The predetermined voltage is called a threshold voltage herein. For instance, for a gated diode created using n-type Field Effect Transistor (FET) technology, voltages above a threshold voltage cause a large amount charge to be stored in an inversion layer and voltages below the threshold voltage cause a substantially small amount of charge, orders of magnitude smaller, or no charge to be stored. For future technology, beyond bulk, Silicon-On-Insulator (SOI) and dual gate finFET, this gate-to-source property can be used when implementing circuits based on gated diodes, as is explained below.

As shown in the following figures, in a conventional Field Effect Transistor (FET) setting, a gated diode can be formed by the source and the gate of a three terminal FET device (either n-type or p-type), with the drain floating (e.g., disconnected or nonexistent), as shown in (for example) FIGS. 1B, 4B, 6 and 8. Sometimes the source and drain of such a FET can be connected together at the same potential and may be viewed as two gated diodes connected in parallel, as shown in (for example) FIGS. 2B, 5B, 7 and 9. In this disclosure, these two situations are used interchangeably. And without specifying explicitly, a gated diode is referred to just the first basic form, only a source and a gate of a semiconductor device.

Figure 1A:
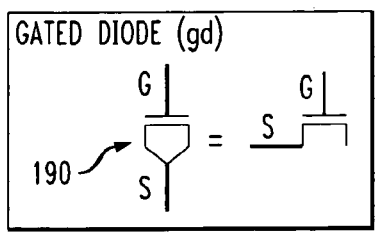
FIG. 1A shows exemplary symbols used for a first n-type gated diode.
Figure 1B:
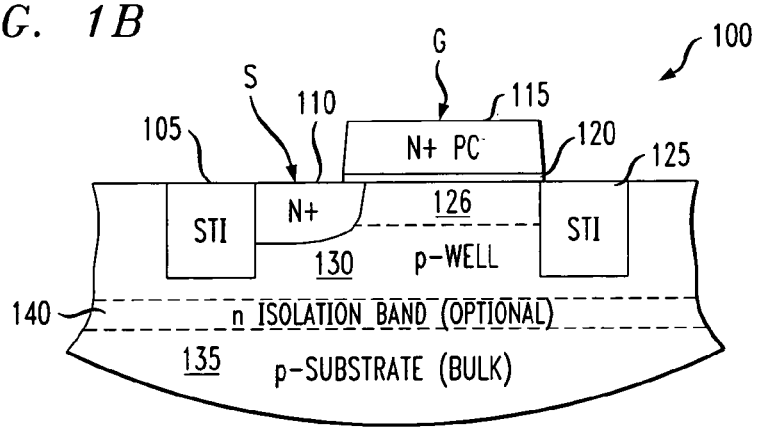
FIG. 1B shows an example of a side view of the first n-type gated diode formed in a semiconductor.
Figure 1C:
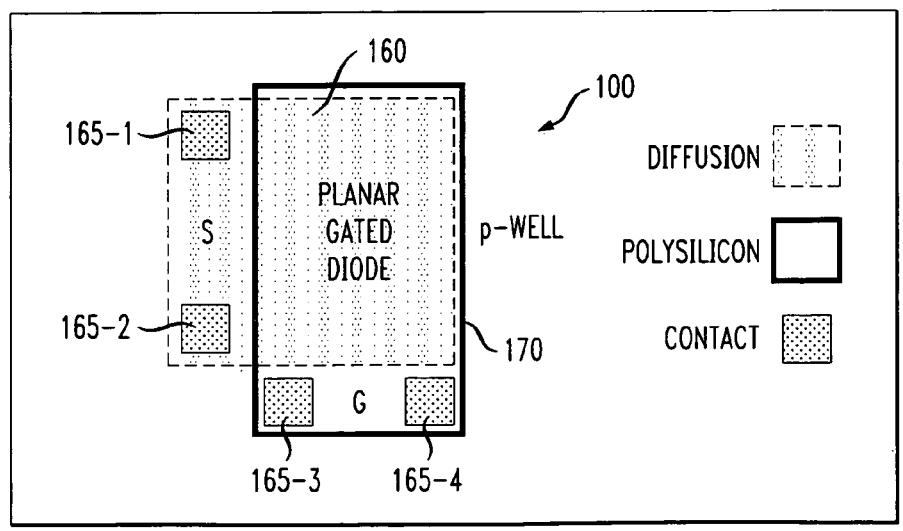
FIG. 1C shows an example of a top view of the first n-type gated diode formed in a semiconductor.

FIG. 1A shows exemplary symbols used for a first n-type gated diode. Symbol 190 is an exemplary symbol for a first n-type gated diode shown in FIGS. 1A-1C. FIG. 1B shows an example of a side view of the first n-type gated diode 100 formed in a semiconductor. The first n-type gated diode 100 comprises a gate insulator 120 formed between a gate 115 (e.g., N+ doped polysilicon) and a p-well 130, a source diffusion region 110, two Shallow Trench Isolation (STI) regions 105 and 125, an optional n isolation band 140, and a p-substrate 135. As described below, the dopant concentration in p-well 130 substantially controls the threshold voltage of the gated diode 100. FIG. 1C shows an example of a top view of gated diode 100. Gated diode 100 comprises a polysilicon gate region 170, a diffusion region 160, at least one contact 165-1 for the polysilicon gate region 170, and at least one contact 165-3 for the diffusion region 160. In the exemplary embodiment in FIG. 1A, four contacts 165-1 through 165-4 are shown.

Figure 2A:
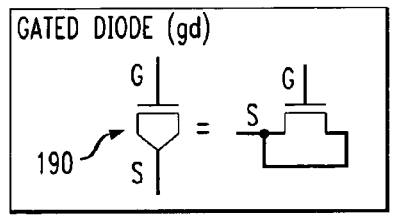
FIG. 2A shows exemplary symbols used for a second n-type gated diode.
Figure 2B:
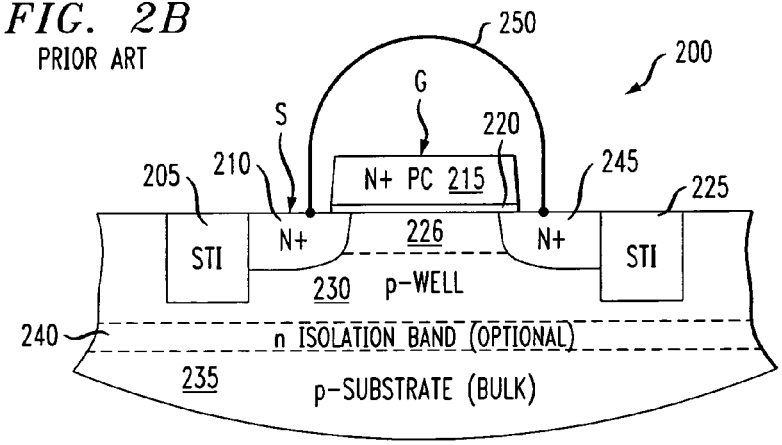
FIG. 2B shows an example of a side view of the second n-type gated diode formed in a semiconductor.
Figure 2C:
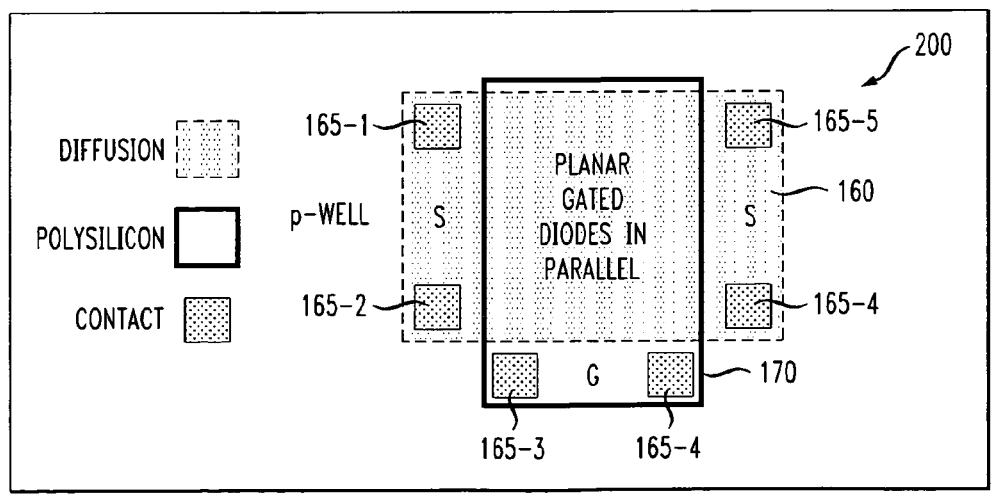
FIG. 2C shows an example of a top view of the second n-type gated diode formed in a semiconductor.

FIG. 2A shows exemplary symbols used for a second n-type gated diode. Symbol 190 is an exemplary symbol for a second n-type gated diode shown in FIGS. 2A-2C. The same symbol 190 is used for both FIGS. 1A and 2A. FIG. 2B shows an example of a side view of the second n-type gated diode 100 formed in a semiconductor. The second n-type gated diode 200 comprises a gate insulator 220 formed between a gate 215 (e.g., N+ doped polysilicon) and a p-well 230, a source diffusion region 210, two STI regions 205 and 225, an optional n isolation band 240, a p-substrate 235, a "drain" diffusion region 245, and a coupling 250 that electrically couples source diffusion region 210 and drain diffusion region 245. As described below, the dopant concentration in p-well 230 substantially controls the threshold voltage of the gated diode 100. FIG. 2C shows an example of a top view of a gated diode 200. The gated diode 200 comprises a polysilicon gate region 170, a diffusion region 160, at least one contact 165-1 for the polysilicon gate region 170, at least one contact 165-3 for one side of the source/drain diffusion region 160, and at least one contact 165-5 for the other side of the source/drain diffusion region 160. In the exemplary embodiment in FIG. 2A, six contacts 165-1 through 165-6 are shown.

Figure 3A:
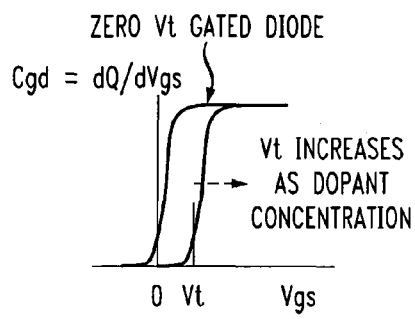
FIG. 3A is a graph illustrating how dopant concentration affects threshold voltage for gated diodes.
Figure 3B:
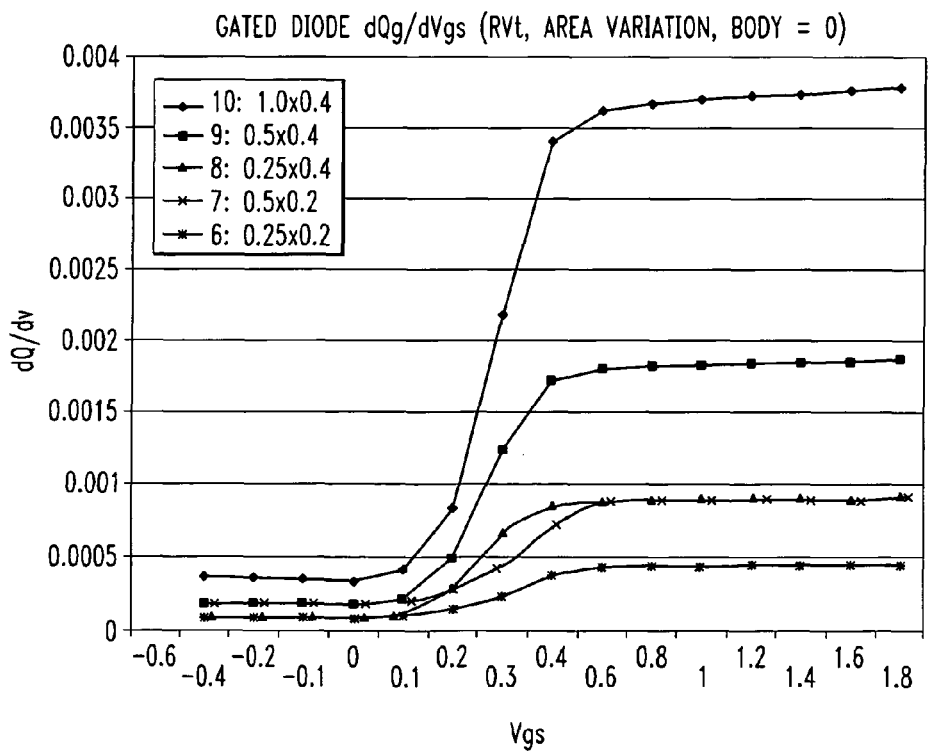
FIG. 3B is a graph illustrating how the capacitance of a gated diode varies with its gate to source voltage (Vgs), across gated diodes with different size.

FIGS. 3A and FIG. 3B show how charge stored by the gated diode 100/200 varies with gate to source voltage (Vgs). When a voltage corresponding to a high voltage (e.g., logic one) is present at the gate 115/215 relative to the source 105/205, and the voltage is higher than the threshold voltage (Vt) of the gated diode 100/200, substantially large amount of charge is stored in the gate 115/215 (e.g., through the inversion layer 126/226 formed underneath the gate 115/215). When a voltage corresponding to a low voltage (e.g., logic zero) is present at the gate 115/215 relative to the source 105/205, and the voltage is lower than the threshold voltage of the gated diode 100/200, substantially small amount of charge, or no charge is stored in the gate 115/215 (e.g., no or very little charge is stored underneath the gate 115/215, as the inversion layer 126/226 will not exist). Thus, the capacitance characteristic of a gated diode versus gate to source voltage (Vgs) is shown in FIG. 3A and FIG. 3B. The capacitance (e.g., as determined by charge stored) is negligible when Vgs is below the threshold voltage, and increases directly with Vgs when Vgs is above the threshold voltage, and settles at a maximum value above certain values of Vgs. When Vgs is above the threshold voltage, certain amount of charge is stored in the gated diode, and the gated diode acts as a capacitor. When Vgs is below the threshold voltage, the gated diode 100/200 is not a capacitor or of negligible capacitance. The area under the graph is the amount of charge stored. It is this varying capacitance over Vgs that gives rise to many new and useful circuits.

FIG. 3B shows also how the capacitance of a gated diode varies with the size of the gate of the gated diode. The maximum value of the capacitance of a gated diode obtained when Vgs is way above the threshold voltage is approximately proportional to the area of the gate of the gated diode, for a given gate oxide thickness and dielectric constant.

It is assumed herein that voltages corresponding to a logic one are high voltages for the technology being used and that voltage corresponding to a logic zero are low voltages for the technology. However, this is only an assumption and the logic levels could be reversed. Additionally, the threshold voltage is assumed to be in absolute value, so a p-type gated diode will have a large capacitance when the voltage on the first terminal is greater in absolute value than the threshold voltage.

In the disclosure, if it is not mentioned explicitly, a gated diode is assumed to be an n-type. For p-type gated diode, voltages and operations are complementary to the n-type, and can be readily designed correspondingly, by someone who is skilled in the art.

The gated diode 100/200 threshold voltage, over a wider range of zero Vt, low Vt, regular Vt, and high Vt can be controlled much more precisely by the amount of implantation (e.g., dopant diffused into p-well 130, 230 or the wells shown in figures below) during manufacturing, than for conventional FETs. This results in more precise threshold voltage that is less sensitive to process variation for the amplifiers, small signal sense amplifiers, and other circuits that use gated diodes. The precise control of the threshold voltage through implantation directly relates to the signal to noise margin of the amplifier, and the signal to noise margin is much enhanced for sensing small signals.

Figure 4A:
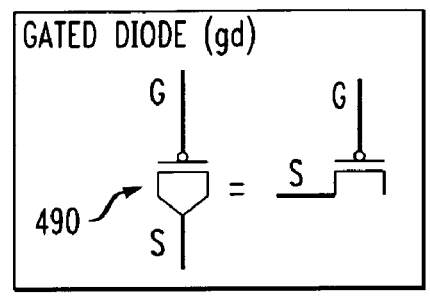
FIG. 4A shows exemplary symbols used for a first p-type gated diode.
Figure 4B:
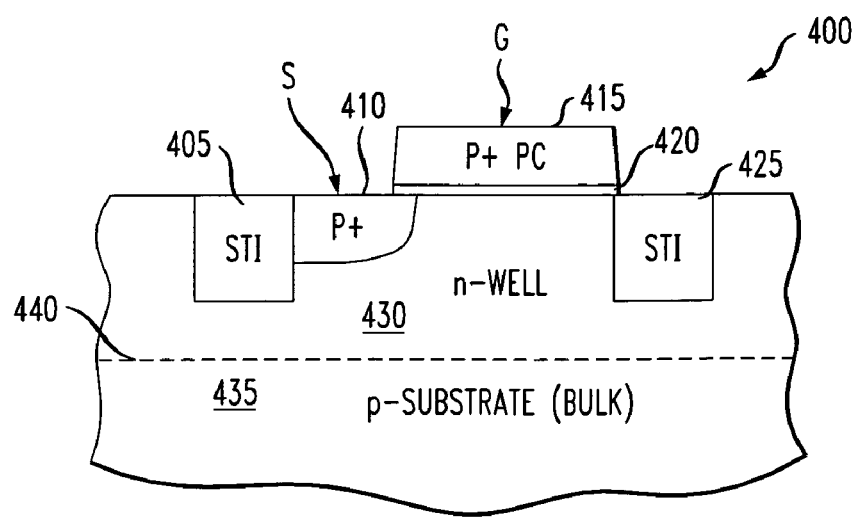
FIG. 4B shows an example of a side view of the first p-type gated diode formed in a semiconductor.

FIG. 4A shows exemplary symbols used for a first p-type gated diode. Symbol 490 is an exemplary symbol for a first p-type gated diode shown in FIG. 4B. The same symbol 490 is used for both FIGS. 4A and 5A. FIG. 4B shows an example of a side view of the first p-type gated diode 400 formed in a semiconductor. The first p-type gated diode 400 comprises a gate insulator 420 formed between a gate 415 (e.g., P+ doped polysilicon) and an n-well 430, a source diffusion region 410, two STI regions 405 and 425, and a p-substrate 435. The dopant concentration in n-well 430 substantially controls the threshold voltage of the gated diode 400.

Figure 5A:
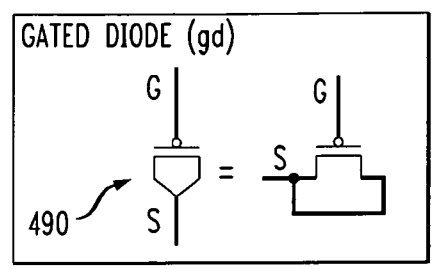
FIG. 5A shows exemplary symbols used for a second p-type gated diode.
Figure 5B:
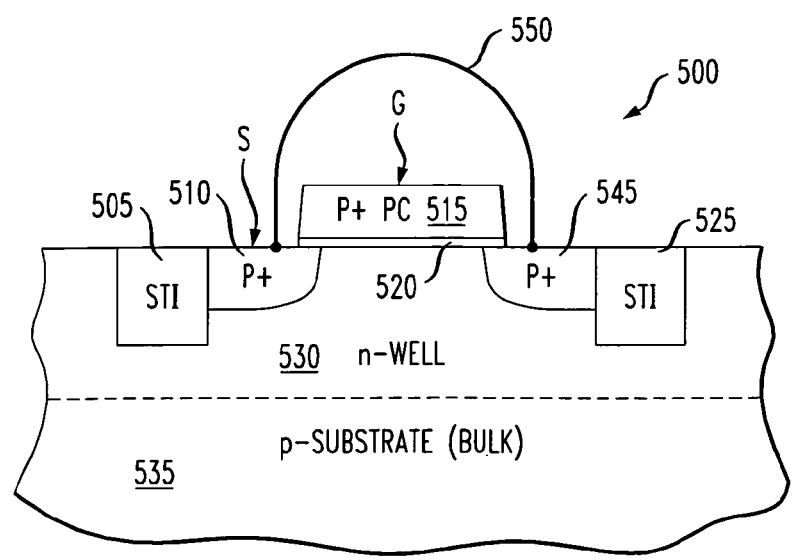
FIG. 5B shows an example of a side view of the second p-type gated diode formed in a semiconductor.

FIG. 5A shows exemplary symbols used for a second p-type gated diode. Symbol 490 is an exemplary symbol for a second p-type gated diode shown in FIG. 5B. FIG. 5B shows an example of a side view of the second p-type gated diode 500 formed in a semiconductor. The second p-type gated diode 500 comprises a gate insulator 520 formed between a gate 515 (e.g., P+ doped polysilicon) and an n-well 530, a source diffusion region 510, two STI regions 505 and 525, a p-substrate 535, a "drain" diffusion region 545, and a coupling 550 that electrically couples source diffusion region 510 and drain diffusion region 545. The dopant concentration in n-well 530 substantially controls the threshold voltage of the gated diode 500.

Figure 6:
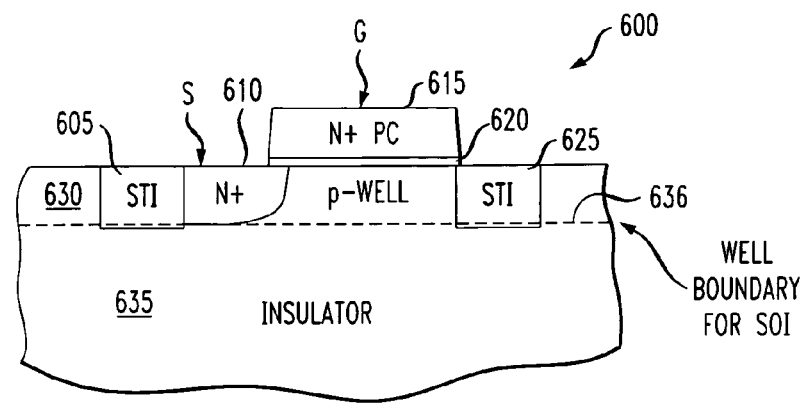
FIG. 6 shows an example of a side view of the first n-type gated diode formed in Silicon-On-Insulator (SOI)

FIG. 6 shows an example of a side view of a first n-type gated diode 600 formed in SOI. The first n-type gated diode 600 comprises a gate insulator 620 formed between a gate 615 (e.g., N+ doped polysilicon) and a p-well 630, a source diffusion region 610, two STI regions 605 and 625, and an insulator 635. The p-well 630 is formed above well boundary 636. The dopant concentration in p-well 630 substantially controls the threshold voltage of the gated diode 600.

Figure 7:
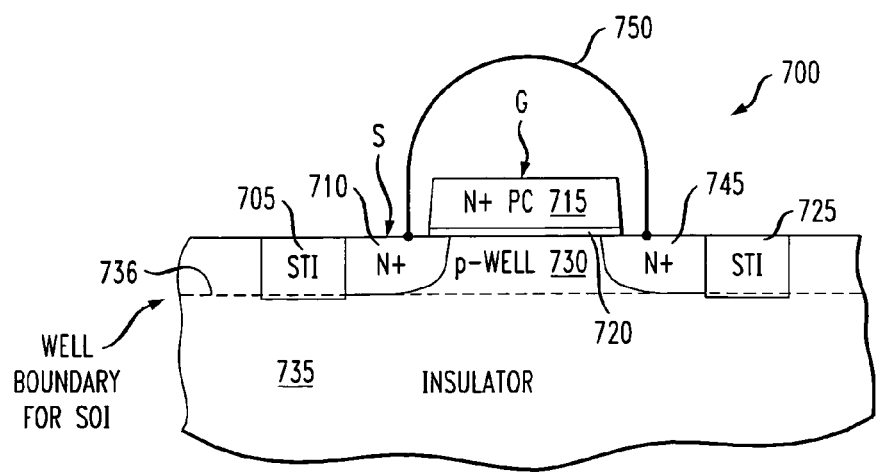
FIG. 7 shows an example of a side view of the second n-type gated diode formed in SOI.

FIG. 7 shows an example of a side view of a second n-type gated diode 700 formed in SOI. The second n-type gated diode 700 comprises a gate insulator 720 formed between a gate 715 (e.g., N+ doped polysilicon) and a p-well 730, a source diffusion region 710, two STI regions 705 and 725, an insulator 735, a "drain" diffusion region 745, and a coupling 750 that electrically couples source diffusion region 710 and drain diffusion region 745. The p-well 730 is formed above well boundary 736. The dopant concentration in p-well 730 substantially controls the threshold voltage of the gated diode 500.

Figure 8:
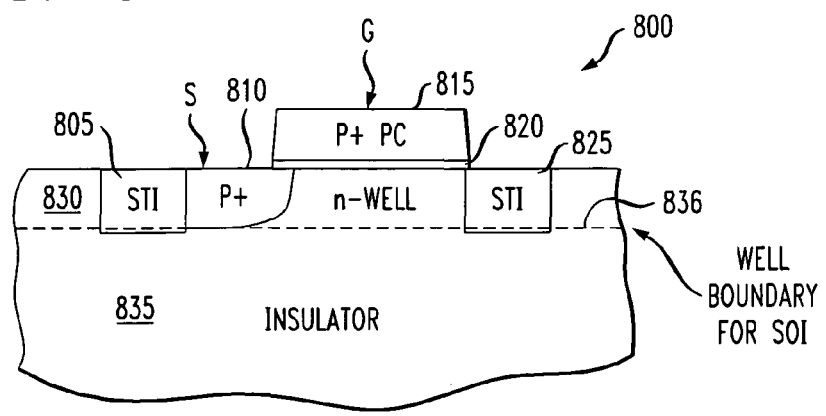
FIG. 8 shows an example of a side view of the first p-type gated diode formed in Silicon-On-Insulator (SOI)

FIG. 8 shows an example of a side view of a first p-type gated diode 800 formed in SOI. The first p-type gated diode 800 comprises a gate insulator 820 formed between a gate 815 (e.g., P+ doped polysilicon) and an n-well 830, a source diffusion region 810, two STI regions 805 and 825, and an insulator 835. The n-well 830 is formed above well boundary 836. The dopant concentration in n-well 830 substantially controls the threshold voltage of the gated diode 800.

Figure 9:
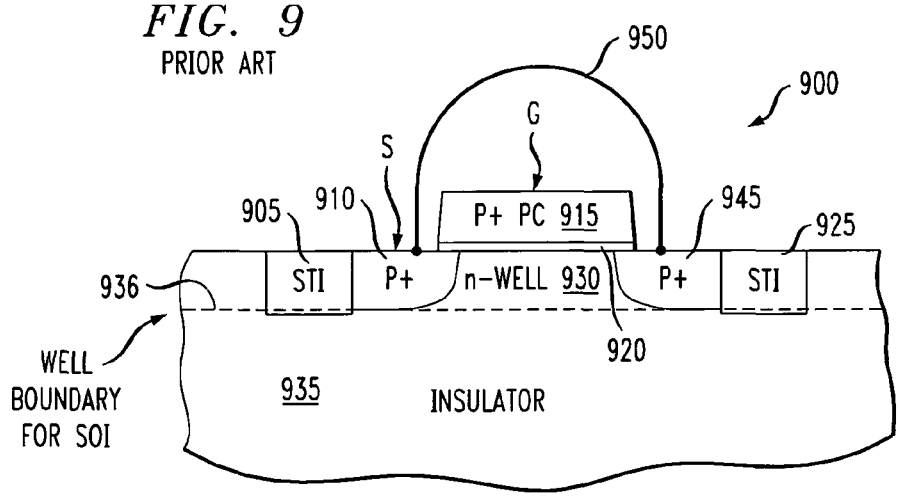
FIG. 9 shows an example of a side view of the second p-type gated diode formed in SOI.

FIG. 9 shows an example of a side view of a second p-type gated diode 900 formed in SOI. The second p-type gated diode 900 comprises a gate insulator 920 formed between a gate 915 (e.g., P+ doped polysilicon) and an n-well 930, a source diffusion region 910, two STI regions 905 and 925, an insulator 935, a "drain" diffusion region 945, and a coupling 950 that electrically couples source diffusion region 910 and drain diffusion region 945. The p-well 930 is formed above well boundary 936. The dopant concentration in p-well 930 substantially controls the threshold voltage of the gated diode 900.

Gated Diode Amplifier and Small Signal Sense Amplifier Circuits

The present disclosure describes circuits including a gated diode amplifier and a gated diode based small signal sense amplifier, for single ended or differential small signal sensing. The gated diode amplifier and small signal sense amplifier typically are comprised of the following:

(1) a gated diode, or
(2) a gated diode and an isolation device together for loaded signal lines.

(1) Gated Diode Amplifier

The signal amplification makes use of the charges stored in the inversion layer (e.g., inversion layer 126/226) of the gate channel. As described above, when a voltage signal corresponding to a high voltage (e.g., logic one) is present at the gate, and the voltage is higher than the threshold voltage of the gated diode, charge is stored in the gate (via mainly an inversion layer underneath the gate). When signal corresponding to a low voltage (e.g., logic zero) is present at the gate, and the voltage is lower than the threshold voltage of the gated diode, no or very little charge is stored in the gate. As shown above, the signal line is connected to the gate of the gated diode. The source of the gated diode is connected to a control line, normally at ground (GND) for n-type gated diode, or supply voltage (VDD) for p-type gated diode.

Figure 11A:
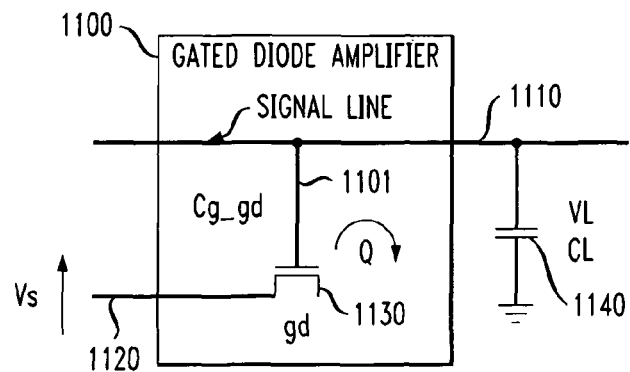
FIG. 11A shows an example of a gated diode amplifier.

Turning briefly to FIG. 11A, a gated diode amplifier 1100 is shown. Gated diode amplifier 1100 is coupled to a signal line 1110, and has a gated diode 1130 whose gate input (and therefore gate) is coupled to the signal line 1110 and whose source input (and therefore source diffusion region) is coupled to a control line 1120. The signal line 1110 has a capacitance 1140 of CL, which is the lumped capacitance from the signal line 1110, coupling capacitance at the gate, and the total capacitance of the connecting circuits (if there is any capacitance) to the signal line. The capacitive load (CL) is not considered part of the gated diode amplifier 1110.

During signal amplification, the voltage (Vs) on the control line is typically boosted. Following the control line voltage, the source voltage (e.g., at the source diffusion region) of the gated diode is also therefore boosted, higher for n-type or lower for p-type, by certain amount (denoted by VB), typically 50 percent to 100 percent of the supply voltage (VDD).

Figure 10:
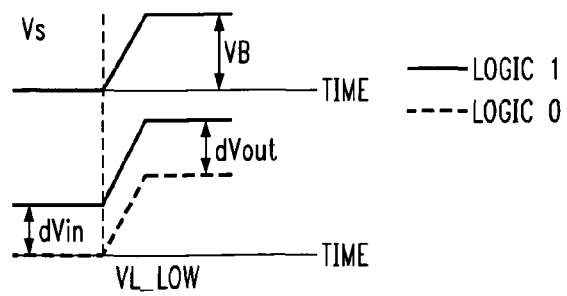
FIG. 10 illustrates a graph of gain for an amplifier when a capacitor is used as a charge storage device.

Turning now to FIG. 10, a graph is shown of gain for an amplifier when a capacitor is used as a charge storage device in the amplifier 1110. In other words, the gated diode 1130 of FIG. 11A is replaced by a conventional or linear capacitor (i.e., a capacitor whose capacitance stays constant with voltage). The first graph, Vs shows how the voltage on the control line 1120 varies. The second graph shows how point 1101 would vary. As seen in FIG. 10, the gain is about one for circuit 1100 when a capacitor is used in place of gated diode 1130. If the signal line 1110 has a high voltage, the output will be VB plus the high voltage (logic one). If the signal line 1110 has a low voltage, the output will be VB plus the low voltage (logic zero). The difference, dVin is whatever difference exists between the logic one and logic zero voltages. Thus, the gain, which is dVout divided by dVin (the logic one voltage minus the logic zero voltage) is about one.

Referring back to FIG. 11A, during signal amplification, the gate voltage is boosted, up for n-type or down for p-type, by an amount close to the source voltage boost, minus some amount, depending on the total capacitance CL, which is the sum of total stray capacitance at the gate coupling to the neighboring devices, capacitance of the line and the total capacitance of the connecting circuits (if there are any). The actual amount of the resulting boost voltage output (e.g., the output on signal line 1110) is calculated in the following analysis.

Figure 11B:
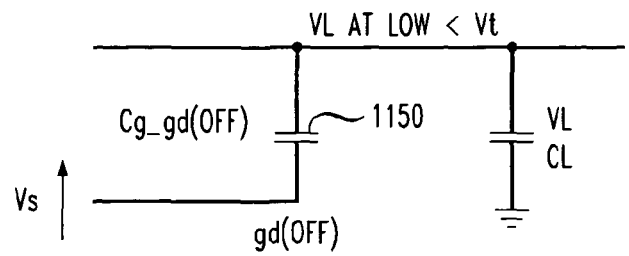
FIG. 11B shows a representative circuit for the gated diode amplifier of FIG. 11A when the gated diode is turned off.

If the signal at the gate is a logic zero, since there is no or very little charge stored in the gate (e.g., at location 1101) and the gate of the gated diode 1130 is OFF (gate to source voltage (Vgs) below threshold voltage), there is little voltage increase at the gate of the gated diode when detecting a logic zero, and the output voltage VL stays at zero or is a substantially small voltage. This is shown in FIG. 11B, where the gated diode 1130 has a very small capacitance, illustrated by reference 1150. Even though Vs might be raised, the resultant output voltage on the signal line 1110 will be low. In other words, the voltage transfer between the control line 1120 and the gate (e.g., point 1101) will be small.

Figure 11C:
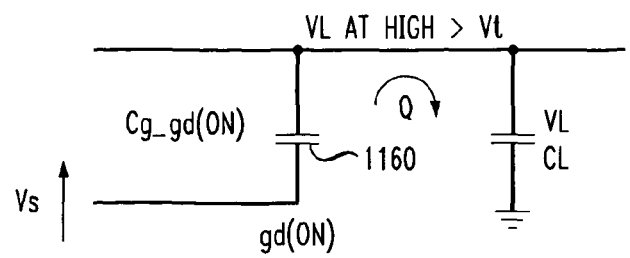

On the other hand, if the signal (voltage measured from GND for n-type or from VDD for p-type) at the gate has been a logic one, which is above the threshold voltage of the gated diode. The gated diode is ON and a substantial amount of charge is stored in the gated diode inversion layer initially. As the Vs is raised, the gated diode 1130 becomes less biased or turned OFF, and the charge in the inversion layer is transferred into all the capacitors (CL) connected to the gate, including stray capacitance, line capacitance, and the capacitance of neighboring devices, such as the gates of an inverter or a buffer. Also, the source and gate can act as a capacitor. When the total capacitance (CL) is within certain range compared to the ON capacitance (Cg_gd(ON)) of the gate diode (shown in FIG. 11C), a large voltage increase results at the gate of the gated diode 1130. Thus, as shown in FIG. 11C, the gated diode can be viewed as a large capacitor, as illustrated by reference 1160 when VL is greater than Vt. In other words, the voltage transfer between the control line 1120 and the gate (e.g., point 1101) will be large.

This results in a large voltage difference, typically 50 to 150 percent of VDD, at the gate of the gated diode, between signals of logic one and logic zero. This is shown in FIG. 12, where dVout is a a large value. Hence a gated diode amplifier 1100 achieves a typical voltage gain of 2-10 times during sensing. The output of the gated diode 1130 is by itself a full CMOS voltage swing and can drive a typical small inverter buffer or a latch.

The following analysis illustrates typical values for a gated diode amplifier. Let Cg_gd(ON) and Cg_gd(OFF) be the gate capacitance of the gated diode when it is ON and OFF, respectively. Then:

$$Rc = Cg\_gd(ON)/CL, \text{ and}$$

$$rc = Cg\_gd(OFF)/CL.$$

For typical operation, the value of the load capacitance (CL) is smaller than or of the same order of magnitude of the ON capacitance of the gated diode (Cg_gd(ON)), but CL is much bigger than the OFF capacitance of the gated diode (Cg_gd(OFF)):

$$Cg\_gd(ON) > CL >> Cg\_gd(OFF).$$

For example, $$Cg\_gd(OFF):CL:Cg\_gd(ON) = 1:10:20, \text{ and}$$

$$Rc = 2, rc = 0.1.$$

First consider a logic one signal above the threshold voltage, where the gated diode is ON.

Let VL_HIGH be the logic one voltage, and VL_LOW be the logic zero voltage, typically zero (or ground) for n-type gated diode.

When the control line Vs is boosted by a voltage of magnitude VB, the output voltage at the gate is the following:

$$Vout(1) = VL\_HIGH + VB\, Rc/(1+Rc) \sim VL\_HIGH + VB,$$
where $(Rc >> 1)$;

$$Vout(0) = VL\_LOW + VB\, rc/(1+rc) \sim VL\_LOW, \text{ where}$$
$(rc << 1)$.

Let dVin be the difference of the gate voltage between 0 and 1 before Vs is raised, dVout be the difference of the gate voltage between 0 and 1 after Vs is raised. The output difference dVout is the following:

$$dVout = VL\_HIGH + VB\, Rc/(1+Rc) - (VB\, rc/(1+rc) + VL\_LOW).$$

The input difference dVin is the following:

$$dVin = VL\_HIGH - VL\_LOW.$$

With VL_LOW=0, the gain is the following:

$$Gain = dVout/dVin \sim 1 + (VB/VL\_HIGH)Rc/(1+Rc) > 1.$$

Consider the following example,

Example 1, where VB=0.8 V, VL_HIGH=0.2 V, VL_LOW=0.

Then:

Gain=5 using Gated Diode, and

Gain=1 using linear capacitor.

Consider another example,

Example 2, where VB=0.8 V, VL_HIGH=0.1 V, VL_LOW=0.

Then:

Gain=9 using Gated Diode, and

Gain=1 using linear capacitor.

For cases where Rc is small (<1), it can be shown that the gain of the gated diode signal amplification is given by $$Gain = 1 + Rc - (Vt\_gd/VL\_HIGH)Rc \sim 1 + Rc,$$

where Vt_gd is the threshold voltage of the gated diode.

Figure 12A:
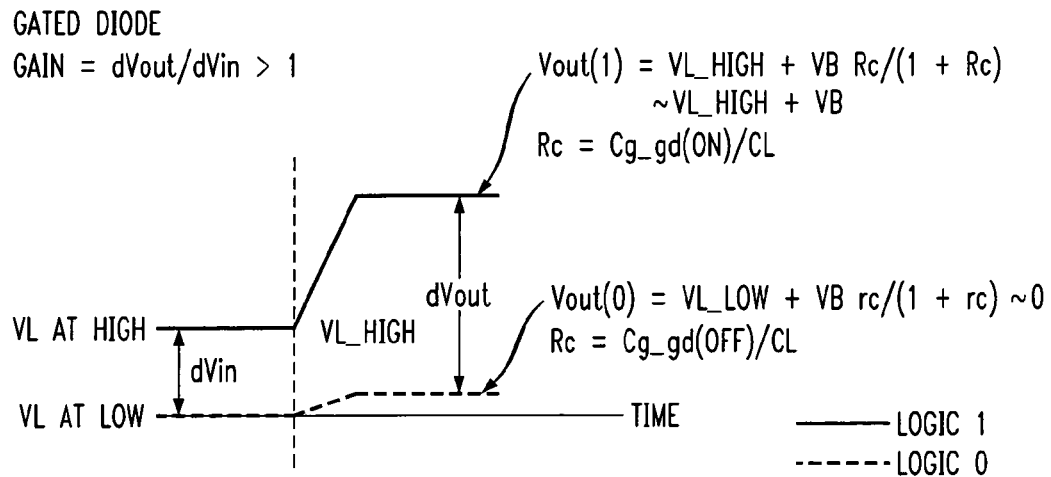
FIG. 12A illustrates a graph of gain for an amplifier when a gated diode is used as the charge storage and transfer device.
Figure 12B:
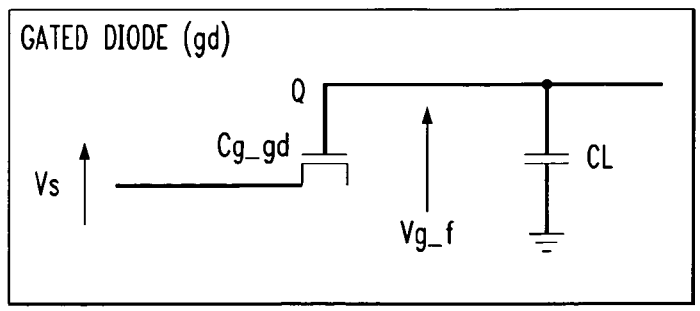
FIG. 12B shows an example of a gated diode amplifier used for FIGS. 12C and 12D.
Figure 12C:
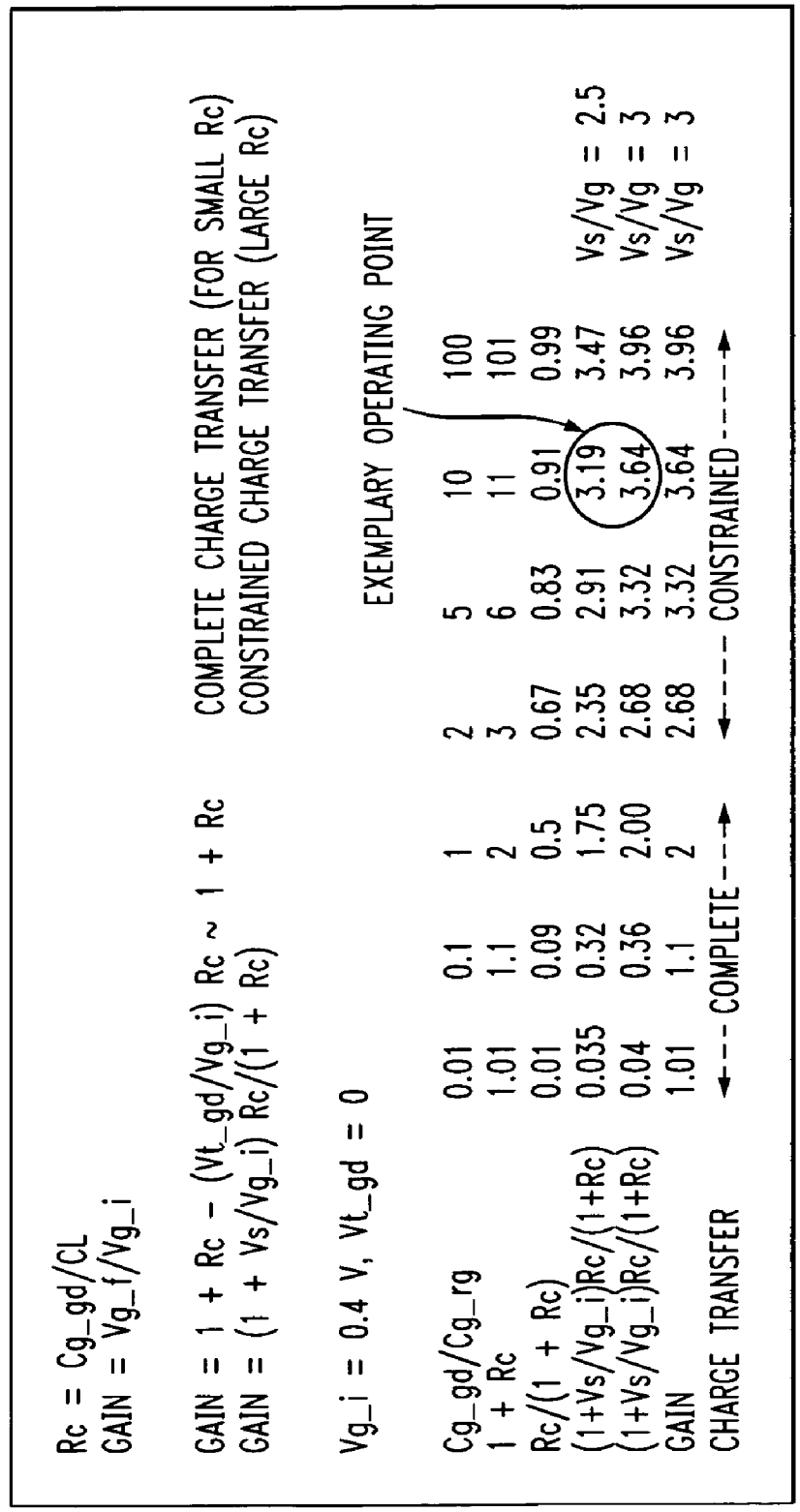
FIG. 12C is a table illustrating complete and constrained charge transfer for the gated diode amplifier of FIG. 12B.
Figure 12D:
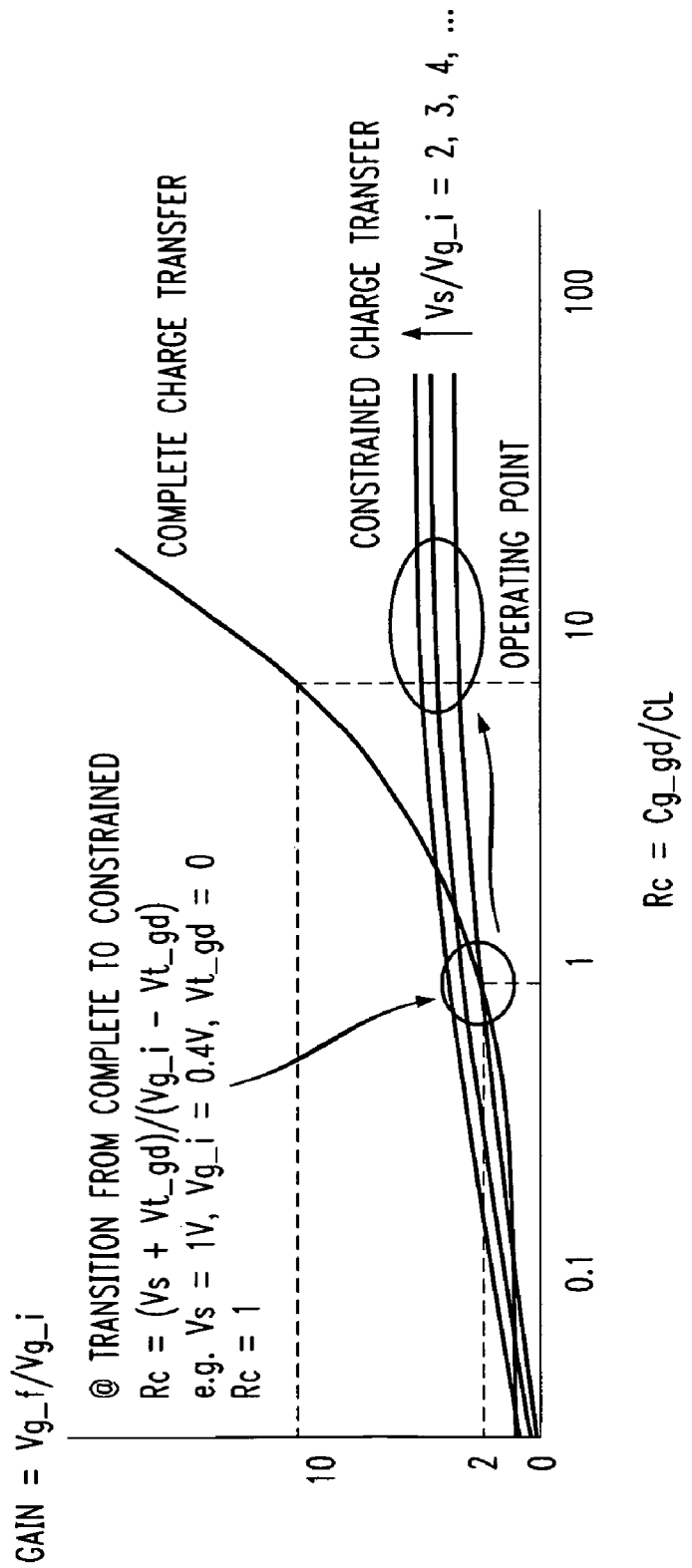
FIG. 12D is a graph showing how the gain of a gated diode amplifier varies with its capacitive load (CL), specifically the ratio Rc=Cg_gd(ON)/CL, where Cg_gd(ON) is the gated diode ON capacitance.

FIG. 12B shows an exemplary gated diode amplifier and the voltages to be used in FIGS. 12C and 12D. In FIG. 12B, the Vg_f is the final voltage at the gate of the gated diode. It should be noted that Vg_i is the initial voltage at the gate of the gated diode.

FIG. 12C shows a table illustrating complete and constrained charge transfer regions for the gated diode amplifier of FIG. 12B. Complete charge transfer means that the gated diode gives all or very close to all of its charge to the load, CL. Constrained charge transfer means that the gated diode gives only a portion of its charge to the load, CL. FIG. 12D shows the voltage gain of a gated diode under different load ratio Rc, where Rc=Cg_gd(ON)/CL, as defined earlier.

When the signal line has a large capacitive load (CL) larger than the ON capacitance of the gated diode, the gain of the basic gated diode amplifier begins to drop, and eventually the gain becomes 1 (i.e., no gain). Further, the high capacitive load will slow down the amplifier.

For example, the following table shows the gain under different ratio of the gated diode ON capacitance (Cg_gd(ON)) to load capacitance (CL). Assume the following:

VB=0.8 V,

VL_HIGH=0.2 V,

VL_LOW=0, and rc=0.1.

The table is then:

| Rc | 10 | 1 | 0.5 | 0.2 | 0.1 | 0.01 |
|---|---|---|---|---|---|---|
| dVout | 0.93 | 0.6 | 0.47 | 0.33 | 0.27 | 0.21 |
| dVin | 0.2 | 0.2 | 0.2 | 0.2 | 0.2 | 0.2 |
| Gain | 4.6 | 3 | 2.3 | 1.7 | 1.35 | 1.05 | where Rc = Cg_gd(ON)/CL, dVout = VL_HIGH + VB Rc/(1 + Rc), dVin = VL_HIGH, and

Gain = dVout/dVin.

(2) Gated Diode Small Signal Sense Amplifier

Figure 13:
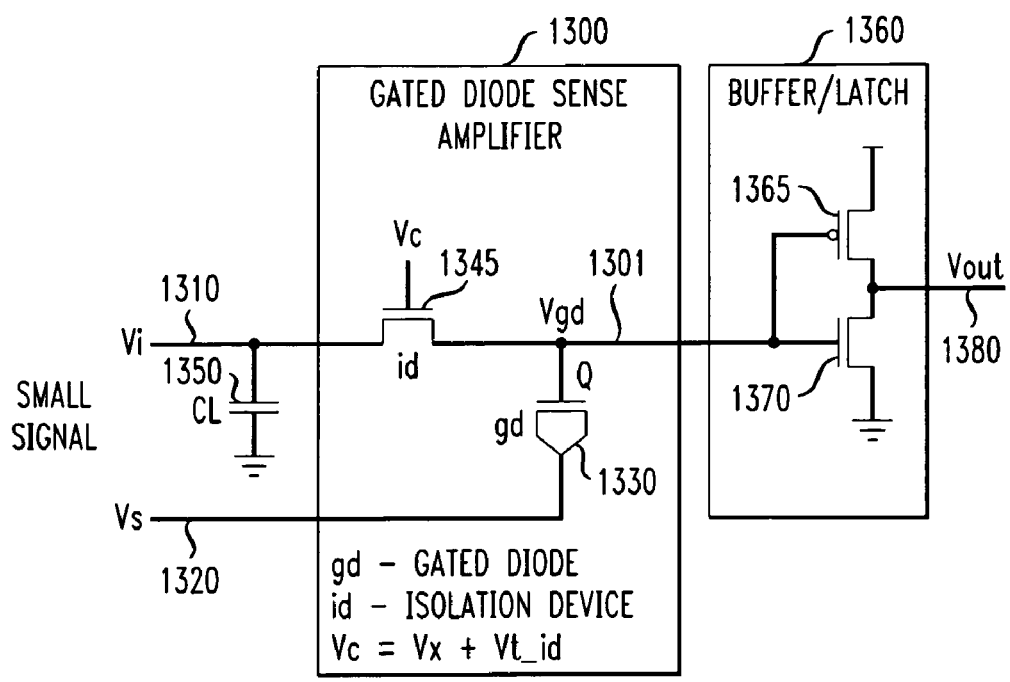
FIG. 13 shows a gated diode sense amplifier implemented using n-type gated diodes.

To handle a signal line with much higher load, the present disclosure describes a second gated diode sense amplifier 1300, shown in FIG. 13. Gated diode sense amplifier 1300 comprises a gated diode 1330 and an isolation device 1345. The isolation device 1345 is coupled to a signal line 1310 and to the input of a buffer or latch 1360. The buffer or latch 1360 is an output circuit that determines a voltage at location 1301 and produces an output 1380 that is indicative of a logic state corresponding to this voltage. For example, less than X volts at location 1301 might be considered a logic zero, while greater than X volts might be considered a logic one. The voltage output by the buffer or latch 1360 (inverting in this example) corresponds to one of the logic states 0 or 1 (i.e., the buffer or latch 1360 could output a logic zero in response to a logic one at location 1301 or output a logic one in response to a logic zero at location 1301). In the example of FIG. 13, the buffer or latch 1360 is an inverter comprising an n-type FET 1370 and a p-type transistor 1365. The control line 1320 is coupled to the source input of the gated diode 1330. The signal line 1310 has a capacitance 1350. The description and operations of the gated diode 1330 portion of the second amplifier 1300 are the same as the first amplifier 1100, including the control line and control voltage (Vs).

This second exemplary configuration of a gated diode sense amplifier 1300 is typically applied to the following cases:

(1) The signal source, Vi, is from a signal line that is very heavily loaded with capacitance. It is desirable to isolate the load on the signal line from the gated diode output signal, Vgd, but allow the small signal on the signal line to pass through and being amplified, so that the gated diode sense amplifier 1300 is not being loaded during sensing, hence amplification speed is not affected.

(2) It is desirable to isolate the gate of gated diode 1330 from the signal line 1310 and signal source, Vi, so that the large increase in voltage at the gate (e.g., output at 1301) does not disturb the original signal source.

The isolation device 1345 is adapted to isolate a signal on the signal line from the first terminal (e.g., the gate) of the gated diode 1330 when the voltage on the first terminal (e.g., the gate) of the gated diode 1330 is above a predetermined value. The isolation device 1345 is adapted to pass a signal from the signal line 1310 to the gated diode 1330 when the voltage on the signal line 1310 is below a predetermined value. The isolation device 1345 is adapted to isolate the heavy load 1350 on the signal line 1310 from the gated diode output 1301.

The first terminal (e.g., the gate) of the gated diode 1330 can detect and amplify the signal on the signal line (e.g., the input), but the voltage on the first terminal (e.g., the gate) of the gated diode (e.g., which is the output of the amplifier 1300) would not affect the signal line, by proper setting of the isolation device control voltage (e.g., gate voltage on the isolation device). That is, the isolation device 1345 can pass and amplify the signal one way from the signal line 1310 to the gated diode output 1301.

The gated diode sense amplifier 1300 is generally used for sensing single ended small signals from ground (GND). As described above, the signal line 1310 is isolated from the source of the gated diode 1330 by an isolation device 1345. The isolation device typically comprises a Field Effect Transistor (FET) having a gate. As described above, the isolation device 1345 is adapted to be turned on when the voltage on the signal line 1310 (which includes voltage on the gate of the gated diode 1330) is below a predetermined value, Vx, described below. The isolation device 1345 is adapted to be turned off "unidirectionally" when the voltage on the gate of the gated diode 1330 is above a predetermined value. The isolation device 1345 has a voltage, Vc, described below, on the gate of the isolation device that is greater than a threshold voltage of the isolation device 1345. As a result, the isolation device 1345 and the gated diode 1330 combined achieve high speed signal amplification for small signals. Although small signals are described herein, amplifier 1300 may also be used for large signals.

The gate of the isolation device 1345 is connected to a constant voltage (Vc), the value of which is determined by the voltage magnitude of the small signal to be sensed and the threshold voltage of the isolation device, as shown below:

$$Vc = Vx + Vt\_\text{isolation\_device} + V\_\text{margin},$$

where Vx is a predetermined voltage which can be the same as the voltage magnitude of the small signal to be sensed, and V_margin is an optional small voltage for design margin.

As described above, the isolation device 1345 isolates the signal line 1310 and the signal source, Vi, from the gated diode sense amplifier 1300, so that when sensing a logic one:

There is low impedance from signal line 1310 and signal source, Vi, to the gated diode 1330, so the original small signal is applied directly to the gate of the gated diode 1330 for detection and amplification; and There is high impedance from gate of the gated diode 1330 to the signal line 1310 and signal source, Vi, so that the large output swing from the gate of the gated diode 1330 (e.g., at output 1301) does not disturb the original small signal.

When the small voltage of logic one, with magnitude Vx, appears on the signal line 1310, the isolation device is ON. So the small signal appears directly on the gate of the gated diode 1330, and can be detected and amplified as described in the first gated diode sense amplifier 1100. When the control voltage (Vs) is boosted, the gate voltage can rise "freely" as in the first gated diode sense amplifier 1100 because the isolation device 1345 is turned OFF as the gated voltage at location 1301 rises, despite the high signal line capacitance 1350. The isolation device 1345 decouples the gate of the gated diode 1330 from the highly loaded signal line 1310, so the voltage gained from the gated diode 1330 is not affected by the signal line 1310 loading, and also the high voltage increase (e.g., at location 1301) from the gate does not propagate into the signal line 1310 and disturb the original signal voltage and signal source. The gain of the second gated diode sense amplifier 1300 remains very close to that of the first gated diode sense amplifier 1100.

Figure 14:
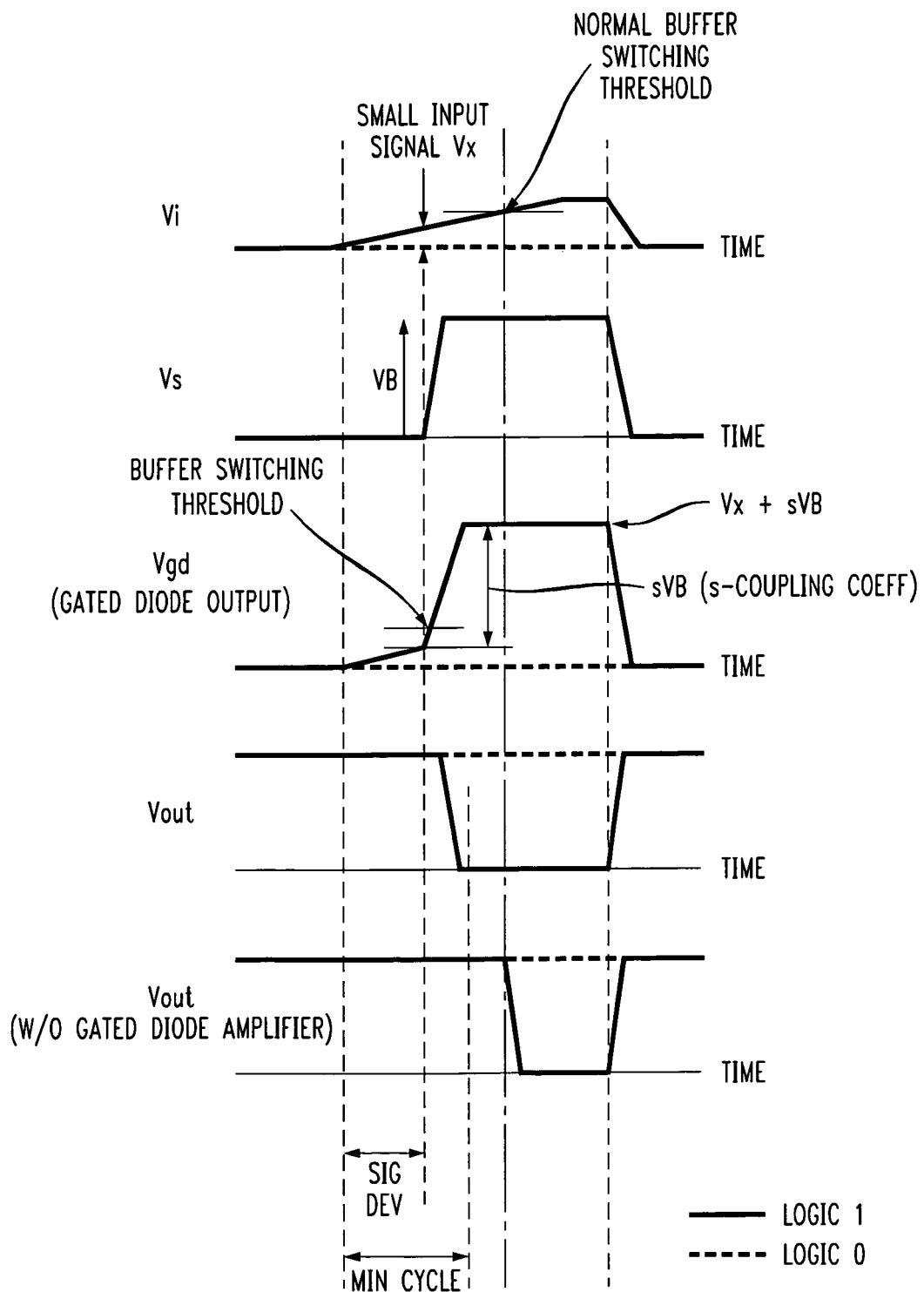
FIG. 14 shows a number of waveforms for the gated diode sense amplifier of FIG. 13.
Figure 16:
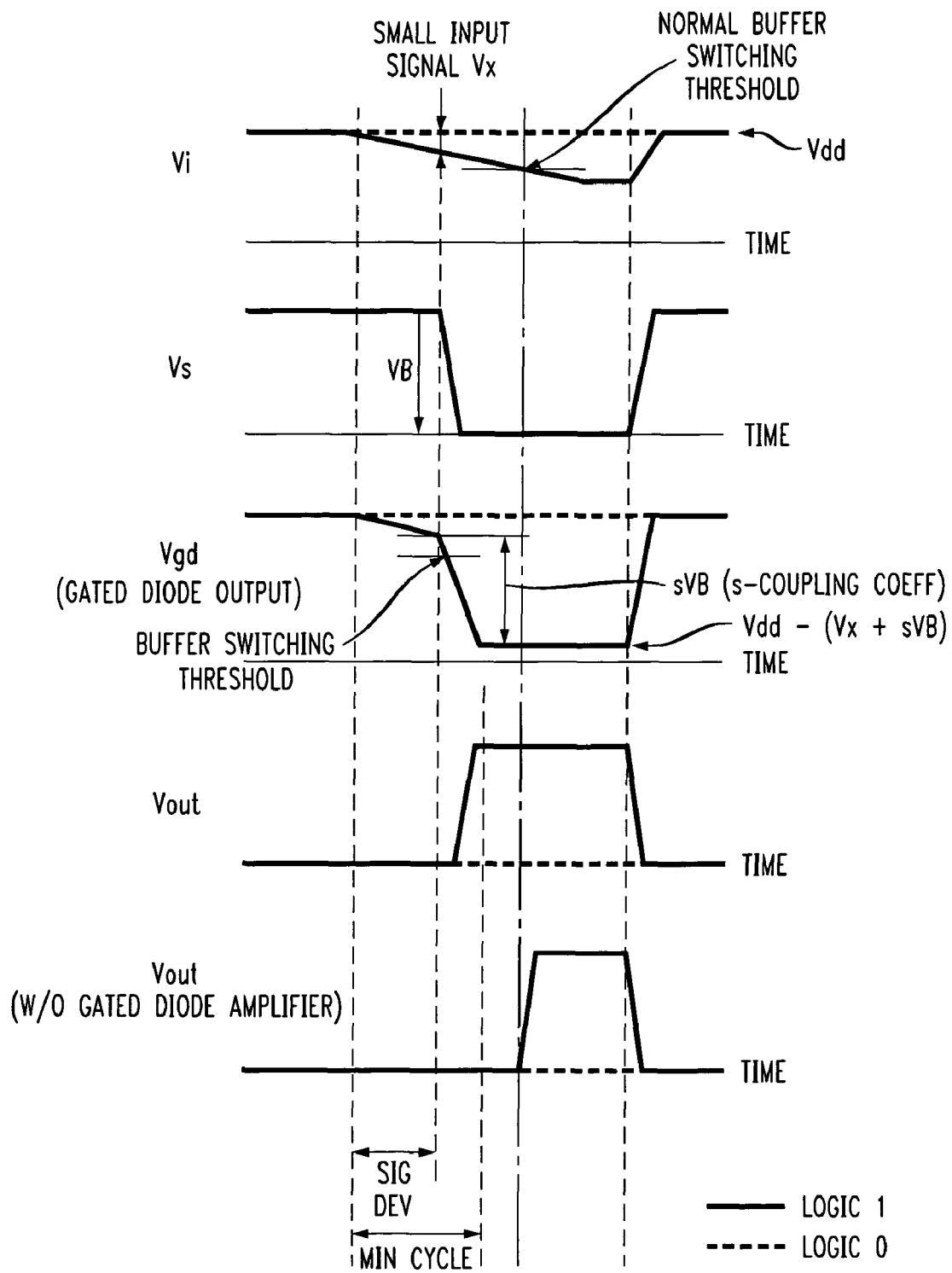
FIG. 16 shows a number of waveforms for the gated diode sense amplifier of FIG. 15.

FIG. 14 shows one possible method of operation of the gated diode sense amplifier 1300. In FIG. 14, the voltage of the various signals of the amplifier are plotted versus time to illustrate a possible method of operation. The first graph, Vi, is the voltage of the small signal (Vi), which is a small signal corresponding to a logic one with magnitude typically only about 10 to 20 percent of the supply voltage (VDD). The signal corresponding to logic zero is also shown, but it stays at 0 V (GND). The second graph is the control voltage (Vs). When the small signal (Vi) is developed along with time, up to certain point monitored in time, the control line 1320 voltage is triggered to boost the gated diode source, by the amount VB. This is shown in the second graph from the top, Vs. The third graph, Vgd, is the voltage at the gate of the gated diode (Vgd, or location 1301), called the gated diode output. If the signal is a logic zero, such Vgd voltage stays almost 0 V (GND). If the signal is a logic one, charge is stored in the gate inversion layer, and the gate voltage (Vgd) is raised at a much faster rate towards the supply voltage (VDD) right after Vs is boosted with little delay from Vs, since the load is small as the signal line 1310 is decoupled from the gate of the gated diode 1330 by the isolation device 1345. The voltage rise is fast and large, and in turn turns on the next stage logic, such as a buffer or latch 1360. The voltage rise is determined earlier than it would be if the voltage rise was caused by a conventional sense amplifier. The switching threshold of the next stage is shown in relationship to the gate voltage (Vgd). The fourth graph, Vout, is from the output 1380 of the next stage buffer, which is typically not part of the basic gated diode sense amplifier 1300. The fifth graph, Vout (without gated diode amplifier), is the voltage output from a conventional sense amplifier without using a gated diode 1330. The working and method of operations of the p-type version is shown in FIG. 16. It is similar and complementary to that described for the n-type version, and should be obvious to those skilled in the art.

Further, when a logic zero is present, the signal source, signal line 1310, and the gated diode output, Vgd, all stay at zero volts with low impedance to the signal source 1310, connected through the low impedance isolation device 1345, both ways in this logic zero case. There is no charge transfer in the gated diode 1330, no active current or leakage current flow in the signal line 1310, hence resulting in very little noise, voltage fluctuation and power (compared to conventional signal ended amplifiers, which can consume power constantly even at logic zero signal state). So on the average, logic zero occurs 50 percent of the time, the signal line 1310 is stable at ground voltage (GND) and not consuming power. Further, it can act as a "ground shield" for wide signal or data buses.

For a heavily capacitive loaded (CL), wide signal buses switching at high frequency, the current gated diode sense amplifiers enable the use, transmission and detection of very small signals over wide, signal buses switching at high frequency with heavily capacitive loaded (CL). This low voltage transmission and detection scheme save a large percentage of active power, $P=CV^2f$. For VDD=0.8V, signal magnitude Vx=0.2 V, typically active power saving is on the order of 75 percent.

Figure 15:
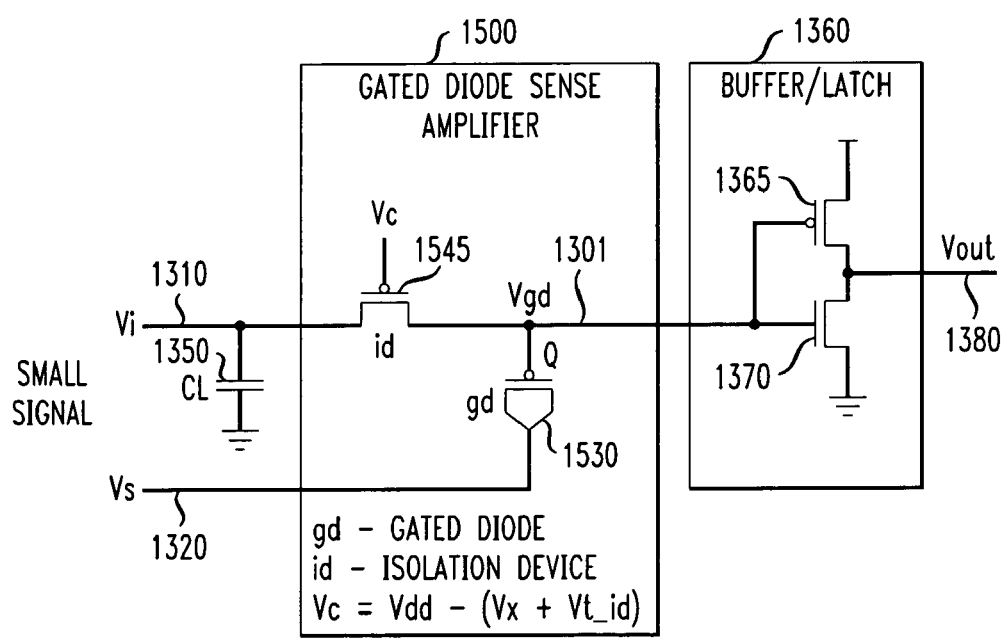
FIG. 15 shows a gated diode sense amplifier implemented using p-type gated diodes.

FIG. 15 shows the p-type version of the gated diode sense amplifier 1300 with an isolation device 1545. The gated diode sense amplifier 1500 is for sensing single ended small signal from the supply voltage (VDD). In a typical bulk silicon or SOI setting, the isolation device 1545 is a PFET device, as is the gated diode 1530. In the case for the p-type gated diode shown in FIG. 15, Vc depends also on VDD, since the signals are measured from the VDD supply voltage. For signal corresponding to logic zero, the signal voltage is at VDD. For signal corresponding to logic one, the small signal voltage "drops" away from VDD, with a magnitude Vx. The Vc of the isolation device is then as follows:

$$Vc=VDD-(Vx+Vt\_isolation\_device+V\_margin).$$

The gated diode 1530 is a p-type gated diode (see, for instance, FIG. 4B, 5B, 8, 9). The operation is complementary to the n-type version and is known for those who are skilled in the art. The output of the gated diode amplifier, the voltage at the gate of the gated diode is commonly connected to a small buffer (e.g., 1360) for further dispatching the detected signal to other part, or connected to a latch (e.g., 1360) for holding the detected signal for further processing.

FIG. 16 shows one possible method of operation of the gated diode sense amplifier 1500. In FIG. 16, similar to FIG. 14, the voltage of the various signals of the amplifier are plotted versus time to illustrate a possible method of operation. The graphs shown in FIG. 16 are the same graphs as shown in FIG. 14, only of opposite polarity (i.e., logic zero is a high voltage and logic one is a low voltage). The first graph, Vi, is the voltage of the small signal (Vi), which is a small signal corresponding to a logic one with magnitude typically only about 10 to 20 percent of the supply voltage (VDD). The signal corresponding to logic zero is also shown, but it stays at VDD. The second graph is the control voltage (Vs). When the small signal (Vi) is developed along with time, up to certain point monitored in time, the control line 1320 voltage is triggered to boost the gated diode source, by the amount VB. This is shown in the second graph from the top, Vs. The third graph, Vgd, is the voltage at the gate of the gated diode (Vgd, or location 1301), called the gated diode output. If the signal is a logic zero, such Vgd voltage stays almost VDD. If the signal is a logic one, charge is stored in the gate inversion layer, and the gate voltage (Vgd) is raised at a much faster rate towards the supply voltage (VDD) right after Vs is boosted with little delay from Vs, since the load is small as the signal line 1310 is decoupled from the gate of the gated diode 1530 by the isolation device 1545. The voltage rise is fast and large, and in turn turns on the next stage logic, such as a buffer or latch 1360. The voltage rise is determined earlier than it would be if the voltage rise was caused by a conventional sense amplifier. The switching threshold of the next stage is shown in relationship to the gate voltage (Vgd). The fourth graph, Vout, is from the output 1380 of the next stage buffer, which is typically not part of the basic gated diode sense amplifier 1300. The fifth graph, Vout (without gated diode amplifier), is the voltage output from a conventional sense amplifer without using a gated diode 1330.

Figure 17:
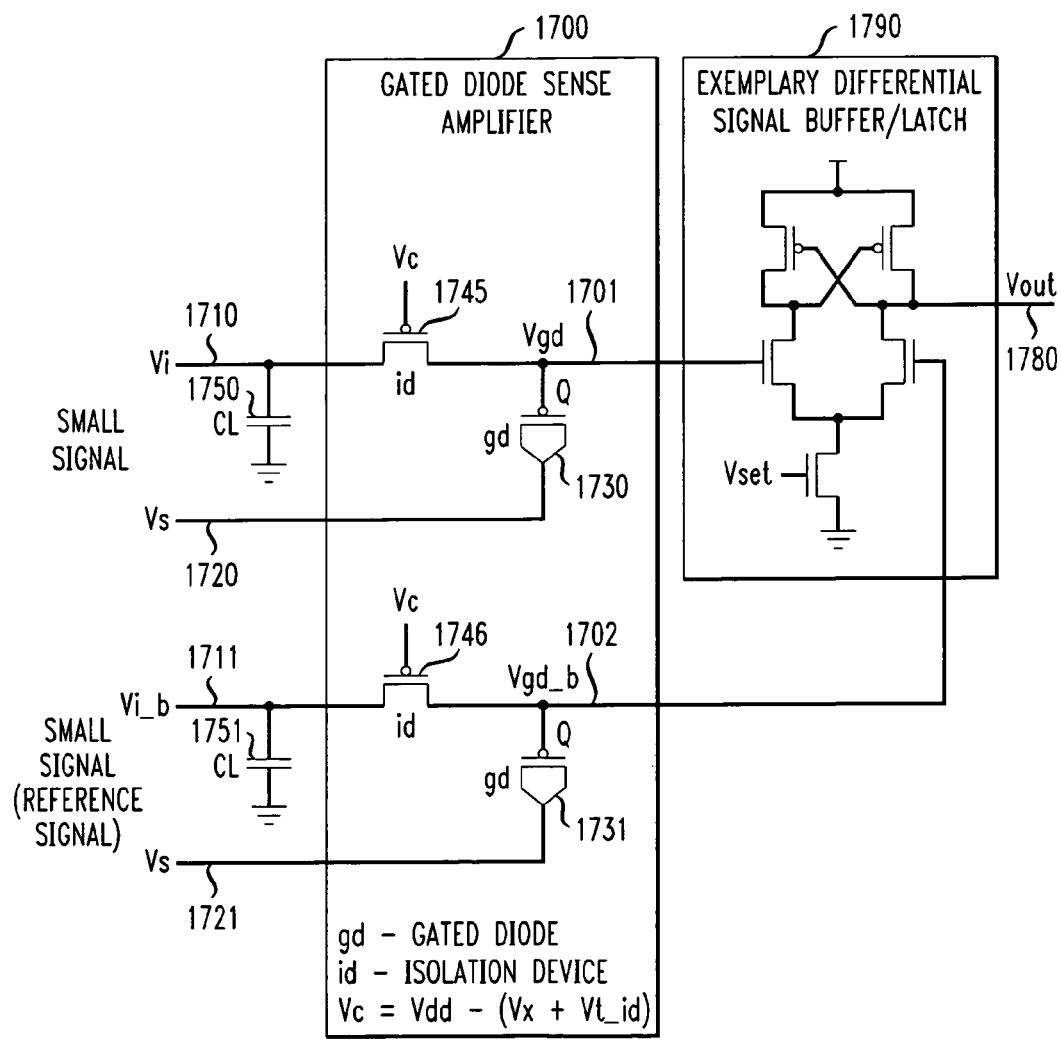
FIG. 17 shows a gated diode differential sense amplifier implemented using n-type gated diodes.

FIG. 17 shows the second gated diode sense amplifier 1700 with isolating device, operating in a differential mode for small signal sensing. Two signal lines 1710, 1711 carry a differential pair of the small signal: one signal is "true" and the other acts as a differential reference voltage. There are two gated diodes 1730, 1731 and isolation devices 1745, 1746, one of each for the true and complementary signals. Each of the gated diode control lines 1720, 1721 is connected to the control signal Vs, and the control voltage is boosted and each amplifier operates as the single ended version of an amplifier. The two outputs 1701, 1702 of the two gated diodes 730, 1731 are commonly connected to a differential buffer or a latch 1790 with differential inputs. The differential buffer or latch 1790 produces an output 1780.

Figure 18:
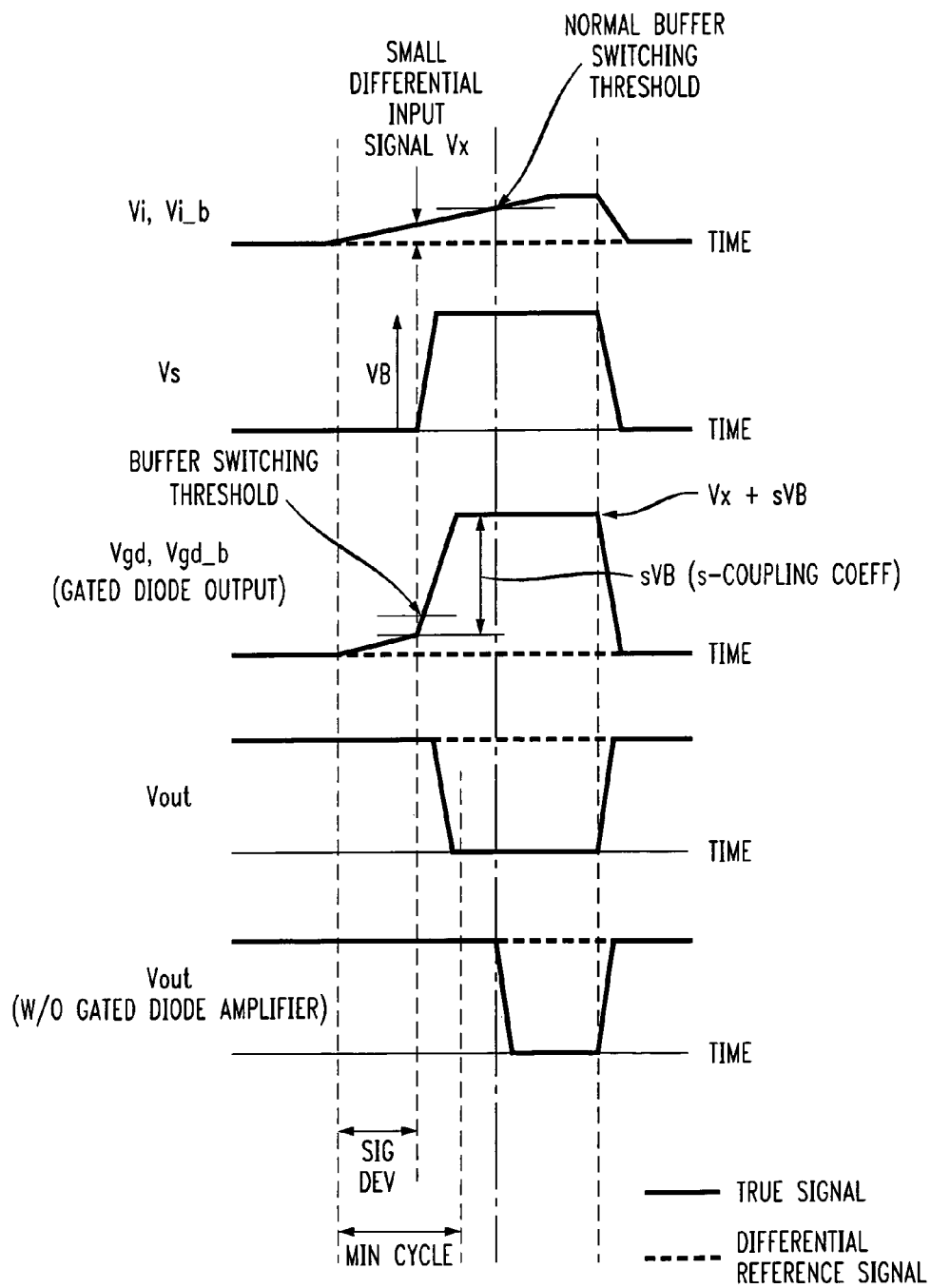
FIG. 18 shows a number of waveforms for the gated diode sense amplifier of FIG. 17.

FIG. 18 shows one possible method of operation of the gated diode differential sense amplifier 1700. In FIG. 18, the voltage of the various signals of the amplifier 1700 are plotted versus time to illustrate a possible method of operation. The first graph, Vi, is the voltage of the small signal (Vi), which is a small signal corresponding to a logic one with magnitude typically only about 10 to 20 percent of the supply voltage (VDD). The differential reference signal of Vi is also shown, as Vi_b. The second graph is the control voltage (Vs). When the small signal (Vi) is developed along with time, up to certain point monitored in time, the control line voltage is triggered to boost the gated diode source, by the amount VB. This is shown in the second graph from the top, Vs. The third graph, Vgd, is the voltage at the gate of the gated diode (Vgd at location 1701 or Vgd_b at location 1702), called the gated diode output. If the signal is a logic zero, such Vgd voltage stays almost 0 V (GND). If the signal is a logic one, charge is stored in the gate inversion layer, and the gate voltage (Vgd) is raised at a much faster rate towards the supply voltage (VDD) right after Vs is boosted with little delay from Vs, since the load is small as the signal line 1710 is decoupled from the gate of the gated diode 1730 by the isolation device 1745. The voltage rise is fast and large, and in turn turns on the next stage logic, such as a buffer or latch 1790. The voltage rise is determined earlier than it would be if the voltage rise was caused by a conventional sense amplifier. The switching threshold of the next stage is shown in relationship to the gate voltage (Vgd). The fourth graph, Vout, is from the output 1780 of the different buffer or latch 1790, which is typically not part of the basic gated diode differential sense amplifier

1700. The fifth graph, Vout (without gated diode amplifier), is the voltage output from a conventional sense amplifier without using a gated diode 1730.

For a given technology, with known values of GND (for n-type) and VDD (for p-type), Vt_isolation_device and V_margin (a design margin), as well as the predetermined voltage, Vx, which is the magnitude of the sense signal, the control voltage (Vc) can be derived and then applied to the gate of the isolation device. Thus, a basic setting can be derived for the isolation device control voltage, Vc, from some known parameters such as VDD, GND, and Vx.

In a general setting, Vc can be a variable voltage, and Vc can be derived from some parameters and signal properties to serve other applications, such as for process, FET threshold voltages, supply voltages, and temperature control, in which Vc is generated from process, voltage and temperature measurements and fed-back to compensate for certain system variations and behaviors. Also Vc can be used to turn ON and OFF the isolation device digitally to perform certain logic functions.

Figure 19A:
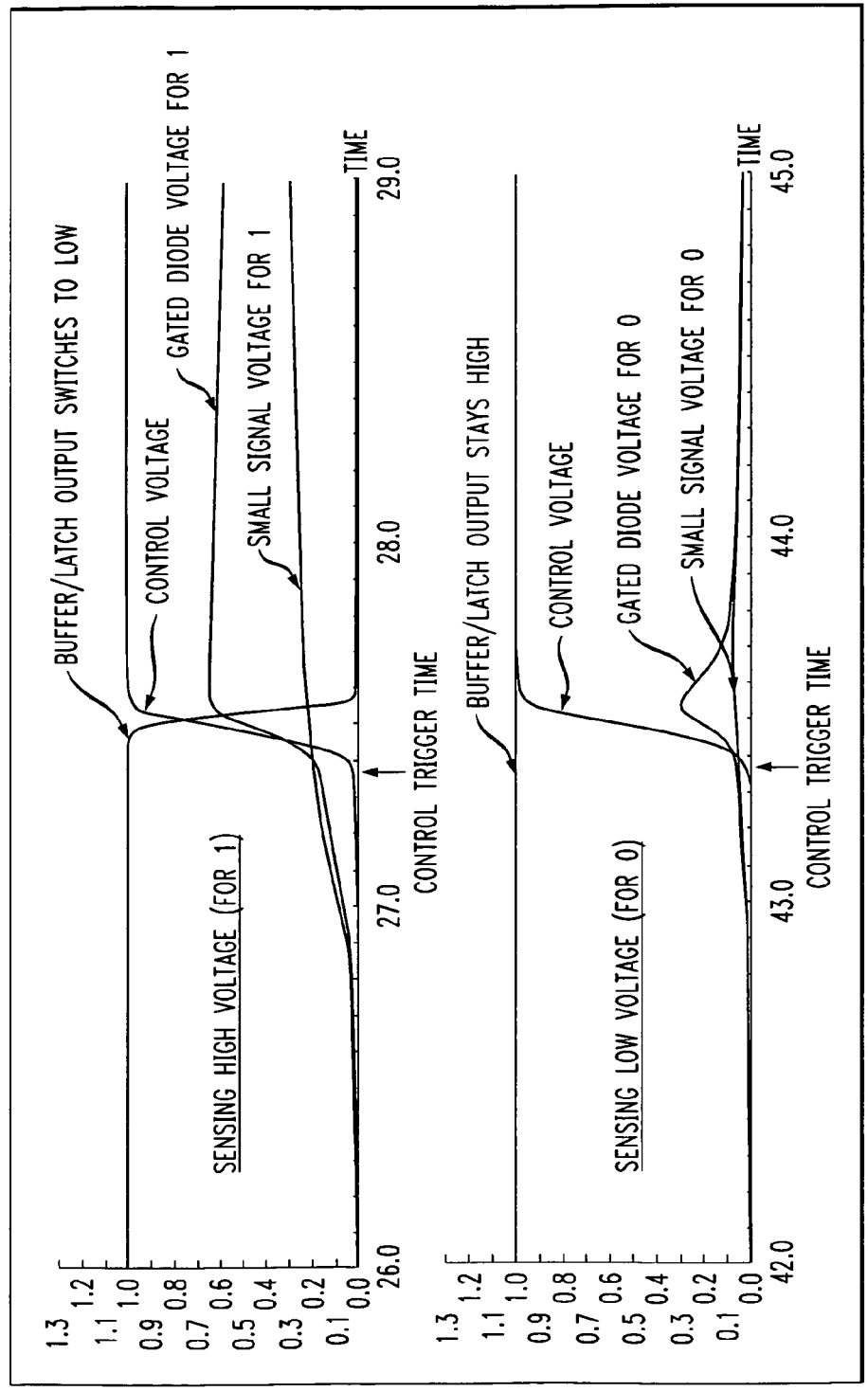
FIG. 19A shows two graphs of waveforms from sensing using a gated diode amplifier, the top graph showing sensing a high voltage for a logic one, and the bottom graph showing sensing a low voltage for a logic zero.

FIG. 19A shows two graphs of waveforms from sensing using a gated diode amplifier, the top graph showing sensing a high voltage for a logic one, and the bottom graph showing sensing a low voltage for a logic zero. The voltages of the control line, signal line input, gated diode gate and buffer/latch output are shown. In the top graph, the gated diode voltage rises quite a bit with a relatively small signal input (e.g., a logic one). The high capacitance of the gated diode allows a large portion of the control voltage to appear at the gate of the gated diode. The buffer/latch output also shows that switching occurs. As can be seen in the bottom graph, the gated diode output voltage does rise a small amount with the small signal input of a logic zero, but the buffer/latch output stays high. The small capacitance of the gated diode allows only a very small portion of the control voltage to appear at the gate of the gated diode.

Figure 19B:
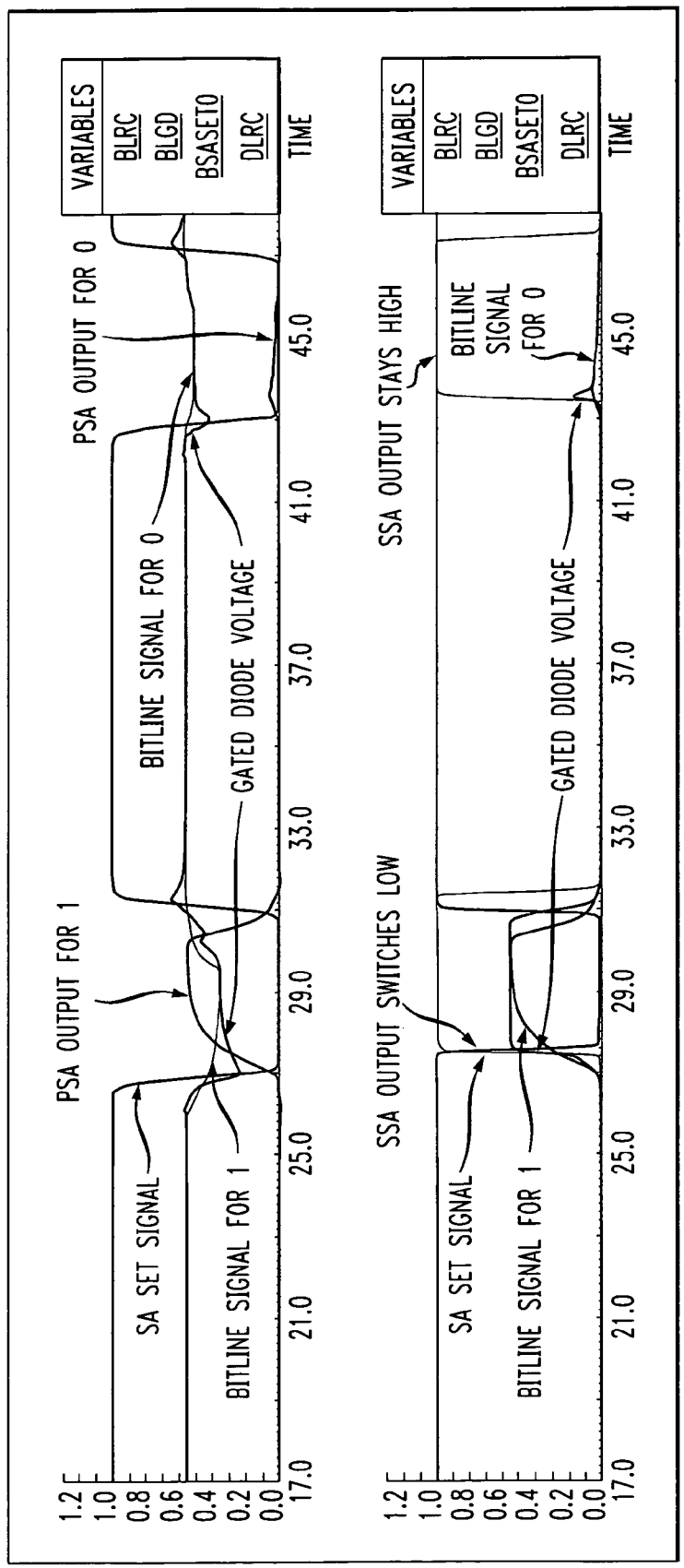
FIG. 19B shows two graphs of waveforms, the top graph from a p-type gated diode sense amplifier, the bottom graph from a n-type gated diode sense amplifier.

FIG. 19B shows two graphs of waveforms, the top graph from a p-type gated diode sense amplifier used in a Primary Sense Amplifier (PSA) for memory, the bottom graph from a n-type gated diode sense amplifier used in a Secondary Sense Amplifier (SSA) for memory. The voltages of the control lines, signal line inputs, gated diode gates, sense amplifier (SA) set signals and sense amplifier outputs are shown. In the left portion of the top graph, the gated diode voltage lowers with a logic one. The PSA output also shows that switching occurs. As can be seen in the right side of the top graph, the gated diode output voltage does lower a small amount for a logic zero, but the PSA output stays low. In the left portion of the bottom graph, the gated diode voltage rises a bit with a logic one. The SSA output also shows that switching occurs. In the right side of the bottom graph, the gated diode output voltage does rise a small amount for a logic zero, but the SSA output stays high.

Figure 20A:
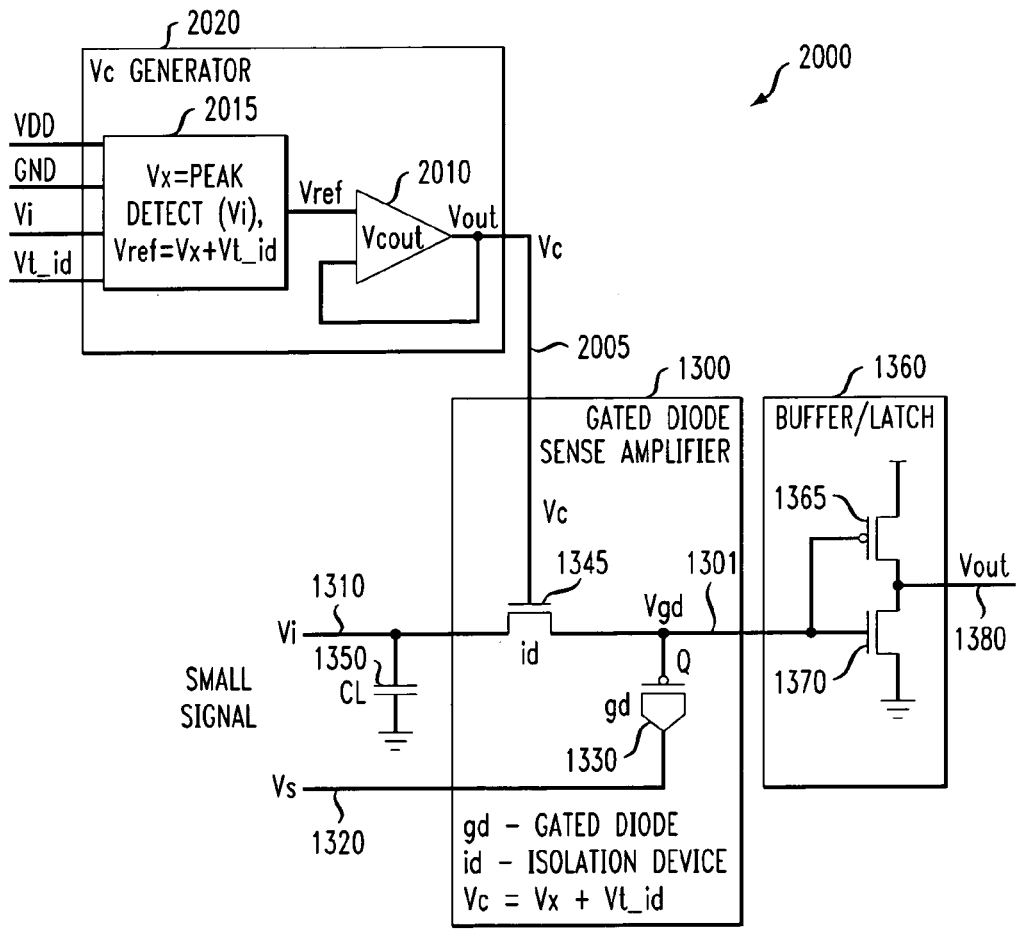
FIGS. 20A and 20B show block diagrams for generating a control voltage (Vc) for a gated diode sense amplifier based on, for example, the input signal, output signal, voltages, threshold voltage (Vt), and temperature.

FIG. 20A shows a block diagram of a circuit 2000 having variable Vc voltage generation. Circuit 2000 comprises a Vc generator 2020, generating Vc 2005, and the gated diode sense amplifier 1300 of FIG. 13. The Vc generator 2020 comprises a reference voltage (Vref) generating circuit 2015 and a voltage output circuit, Vcout, 2020. The techniques described in FIG. 20A may be applied to the sense amplifiers shown in FIGS. 15 and 17. In the exemplary embodiment shown in FIG. 20A, Vc is equal to Vx+Vt_id. The predetermined voltage Vx is the magnitude of the input signal Vi and is obtained by detecting the peak of the signal Vi using a typical peak detecting circuit (not shown) as part of the Vref generating circuit 2015. Vx is added to an on-chip measured threshold voltage of the isolation device (Vt_id). The combined signal Vx+Vt_d forms Vref. If Vc is chosen to be Vx+Vt_id+V_margin as described earlier, the design margin V_margin can be included accordingly. The voltage Vc is generated by the voltage output circuit (Vcout) 2010, which is controlled by a reference voltage input (Vref) and the feedback output voltage (Vout). The output Vout is compared with the reference voltage Vref in the output circuit (Vcout), so Vc is generated and self-adjusted dynamically according to Vref to satisfy operation conditions.

Figure 20B:
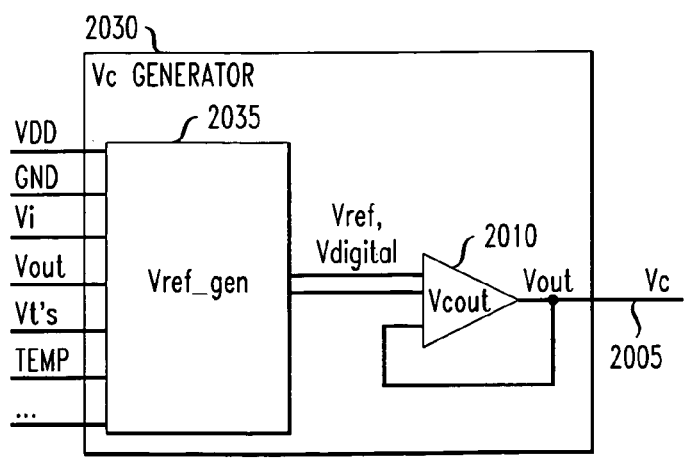

FIG. 20B shows a scheme and block diagram to illustrate the generation of Vc in a general setting of signal voltages, supply voltages and process parameters. In this example, the Vc generator 2030 has a Vref generating circuit 2035 that can accept a number of inputs. For example, the reference voltage Vref can be derived based on the input signal, the output signal, some on-chip process parameters such as temperature, threshold voltage of some transistors, voltages, and more inputs (illustrated as " . . . " in FIG. 20B). The reference voltage (Vref) and the feedback output voltage (Vout) of the output circuit (Vcout) produce the control voltage Vc dynamically for a sense amplifier (e.g., such as sense amplifier 1300). Further, the output circuit (Vcout) can be controlled digitally by one or more input signals (Vdigital), shown in FIG. 20B. The signal(s) (Vdigital) is one or more digital signals derived typically from the sense amplifier input signal (Vi) and sense amplifier output (Vout), which are fed into the Vref generating circuit (Vref_gen) 2035 based on some digital operations. The digital signal(s) (Vdigital) is then used to control the output circuit (Vcout) digitally (e.g., ON and OFF) according to certain logic functions (not shown), in combination with the other reference voltage (Vref), which adjusts the output (Vout) value to certain, typically precise, level. As a result, the control voltage Vc can be generated dynamically, both precisely and digitally, according to certain analog operation requirements and logical functions.

It is to be understood that the embodiments and variations shown and described herein are merely illustrative of the principles of this invention and that various modifications may be implemented by those skilled in the art without departing from the scope and spirit of the invention.

What is claimed is:

1. A method for amplifying signals, the method comprising the steps of:
   determining that a voltage on a signal line is to be amplified; and
   modifying voltage on a control line, wherein the control line is coupled to a second terminal of a two terminal semiconductor device, the two terminal semiconductor device having the second terminal and a first terminal, the first terminal coupled to the signal line, the second terminal coupled to the control line, wherein the two terminal semiconductor device is adapted to have a capacitance when a voltage on the first terminal is in a first voltage range and to have a lower capacitance when the voltage on the first terminal is in a second voltage range, wherein said first and second voltage ranges are defined by a threshold voltage, and wherein the control line is adapted to be coupled to a control signal and wherein the signal line is adapted to be coupled to a signal and to be an output; and
   wherein an isolation device is intermediate the signal line and the two terminal semiconductor device, the isolation device having an input, an output and a control terminal, the input of the isolation device coupled to the signal line and the output of the isolation device coupled to the first terminal, wherein the output of the isolation device is adapted to be the output, and wherein the method further comprises the step of applying a control voltage to the control terminal of the isolation device, the control voltage being greater than a threshold voltage of the isolation device.

2. The method of claim 1, wherein the control voltage is applied to the control terminal of the isolation device plus an expected voltage for a signal coupled to the input of the isolation device, whereby the isolation device passes signals having voltages less than the expected voltage and does not pass signals having voltages greater than the expected voltage.

3. The method of claim 1, wherein the isolation device comprises a Field Effect Transistor (FET) and wherein the FET is adapted to be turned on when voltage on the signal line is below a predetermined value, and is adapted to be turned off when voltage on the first terminal of the two terminal semiconductor device is above a predetermined value.

4. The method of claim 3, wherein the FET is an n-type FET, wherein the control terminal of the FET is the gate of the FET, and wherein the step of applying a control voltage to the control terminal of the isolation device further comprises the step of applying a voltage above a threshold voltage to the gate of the FET.

5. The method of claim 3, wherein the FET is a p-type FET, wherein the control terminal of the FET is a gate, and wherein the step of applying a control voltage to the control terminal of the isolation device further comprises the step of applying a voltage below a threshold voltage to gate of the FET.

6. The method of claim 1, further comprising the step of generating the control voltage by using at least a reference voltage and the control voltage.

7. The method of claim 6, wherein the step of generating the control voltage further comprises the step of generating the reference voltage by using one or more of the following: a ground voltage; a power supply voltage; the signal; the threshold voltage; one or more additional threshold voltages; one or more temperature signals; and the control voltage.

* * * * *